US008432156B2

(12) United States Patent
Almalki et al.

(10) Patent No.: US 8,432,156 B2

(45) Date of Patent: Apr. 30, 2013

(54) SYSTEM AND METHOD FOR OBTAINING MAGNETOMETER READINGS FOR PERFORMING A MAGNETOMETER CALIBRATION

(75) Inventors: Nazih Almalki, Waterloo (CA); Laura Mahan, Kanata (CA); Jeffrey Alton Hugh Dods, Kitchener (CA)

(73) Assignee: Research In Motion Limited, Waterloo (CA)

( * ) Notice: Subject to any disclaimer, the term of this patent is extended or adjusted under 35 U.S.C. 154(b) by 98 days.

(21) Appl. No.: 13/104,420

(22) Filed: May 10, 2011

(65) Prior Publication Data

US 2012/0285274 A1 Nov. 15, 2012

(51) Int. Cl.
*G01R 35/00* (2006.01)

(52) U.S. Cl.
USPC .......................................................... 324/202

(58) Field of Classification Search ........................ None
See application file for complete search history.

(56) References Cited

U.S. PATENT DOCUMENTS

| | | | | |
|---|---|---|---|---|
| 2009/0146010 | A1* | 6/2009 | Cohen | 244/137.1 |
| 2010/0121599 | A1* | 5/2010 | Boeve et al. | 702/93 |
| 2010/0307016 | A1* | 12/2010 | Mayor et al. | 33/356 |

FOREIGN PATENT DOCUMENTS

| | | | |
|---|---|---|---|
| JP | 2004-012416 | A | 1/2004 |
| JP | 2006-047038 | A | 2/2006 |
| JP | 2006-098200 | A | 4/2006 |
| WO | 2006/104967 | A2 | 10/2006 |

OTHER PUBLICATIONS benjohn75; Screenshots from "The REAL iPhone Compass Calibration Tutorial"; youtube; Jun. 8, 2010; retrieved from http://www.youtube.com/watch?v=86yUpUt8U6s on Oct. 10, 2011.

Tabellion, M.; Search Report from corresponding European Application No. 11165598.1; search completed Oct. 13, 2011.

iPhone and iPad: Calibrating Compass; Jan. 31, 2011; http://support.apple.com/kb/TS2767.

Harshas, R.J.; SkEye Planetarium and PUSHTO guide for Android; Apr. 18, 2011.

Panasonic Owner's Manual for advance features: Digital Camera Model NO. DMC-TS3, p. 91; http://panasonic.ca/viewing/ALL/DMC-TS3P/OI/vqt3140/vq3140.pdf, available at least as earlier as Apr. 29, 2011.

* cited by examiner

*Primary Examiner* — Robert R Raevis
(74) *Attorney, Agent, or Firm* — Brett J. Slaney; Blake, Cassels & Graydon LLP

(57) ABSTRACT

A system and method of obtaining magnetometer readings for performing a magnetometer calibration are provided. The method comprises detecting initiation of a magnetometer calibration; displaying a plurality of visual elements representing at least a pair of movements, each of the movements orienting a device comprising the magnetometer in substantially opposite positions along a respective axis; and obtaining at least one magnetometer reading during movement of the device. The visual elements may include one in an upright position, one in an upside down position, one facing a first direction and one illustrating the device facing in a second direction. A path may also be defined between the plurality of visual elements using one or more arrows.

31 Claims, 17 Drawing Sheets

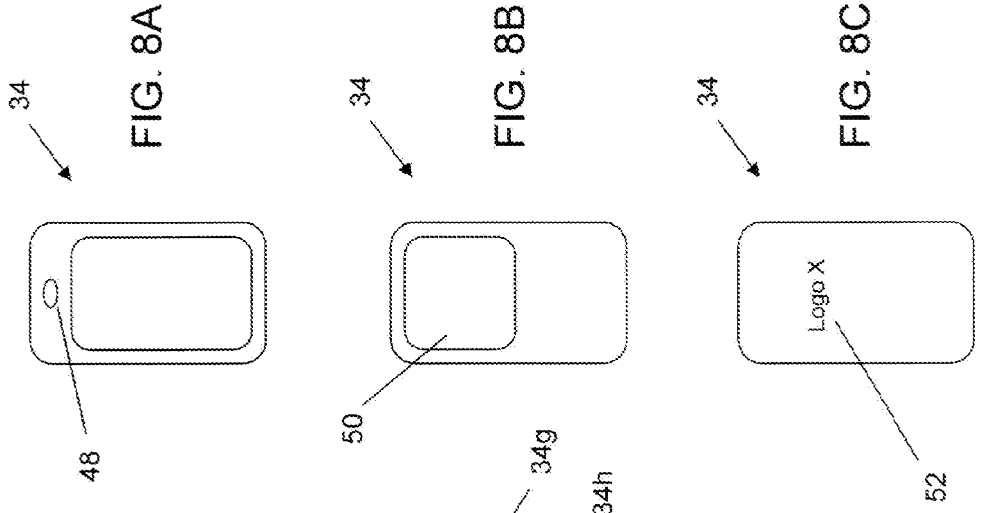
FIG. 8A
FIG. 8B
FIG. 8C
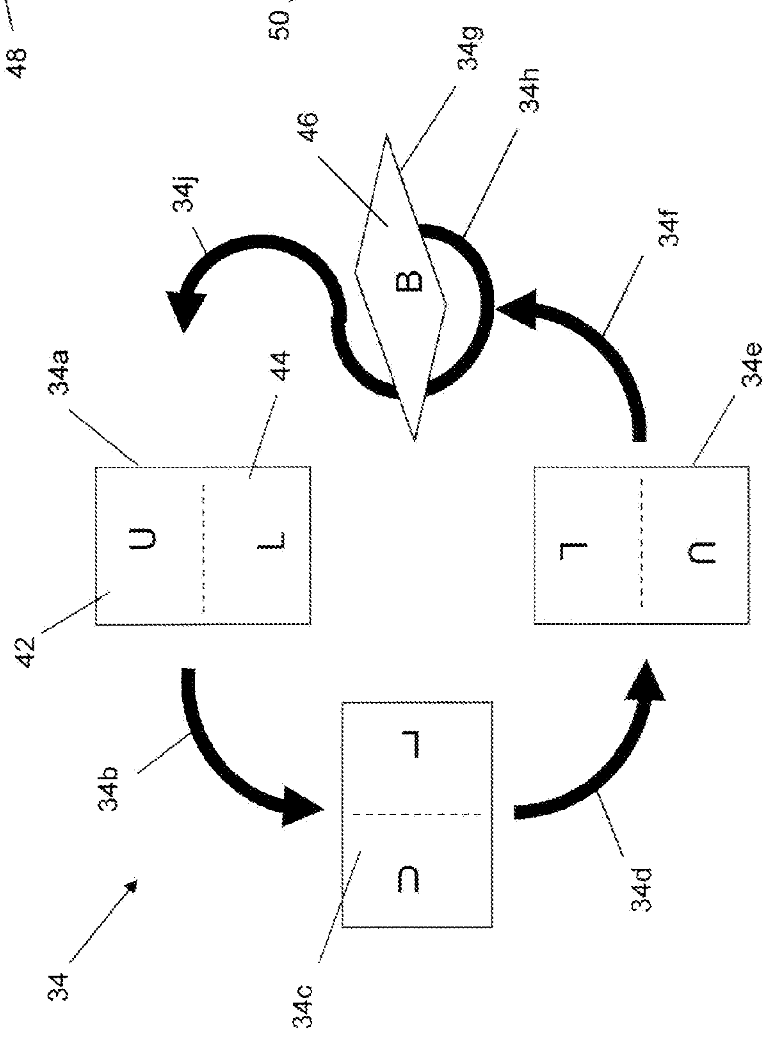
FIG. 7

SYSTEM AND METHOD FOR OBTAINING MAGNETOMETER READINGS FOR PERFORMING A MAGNETOMETER CALIBRATION

TECHNICAL FIELD

The following relates to systems and methods for obtaining magnetometer readings for performing a magnetometer calibration.

DESCRIPTION OF THE RELATED ART

A magnetometer is an instrument used to measure the strength and/or direction of the magnetic field in the vicinity of the instrument. Many electronic devices exist that utilize a magnetometer for taking measurements for a particular application, e.g. metal detectors, geophysical instruments, aerospace equipment, and mobile communications devices such as cellular telephones, PDAs, smart phones, tablet computers, etc., to name a few.

Devices that comprise a magnetometer and have a display and processing capabilities, e.g. a smart phone may include a compass application for showing direction on the display.

Mobile communication devices, such as those listed above, can operate in many different locations and under various circumstances. Changes in the environment in which the device operates can affect the operation of the magnetometer. As such, the magnetometer may need to be calibrated at certain times.

BRIEF DESCRIPTION OF THE DRAWINGS

Embodiments will now be described by way of example only with reference to the appended drawings wherein:

FIG. 7 is a set of visual elements for illustrating a series of movements to be executed during a foreground magnetometer calibration.

FIGS. 8A to 8C illustrate graphical elements including example distinguishing features for orienting a mobile device in performance of a series of movements to be executed during a foreground magnetometer calibration.

DETAILED DESCRIPTION

Figure 1:
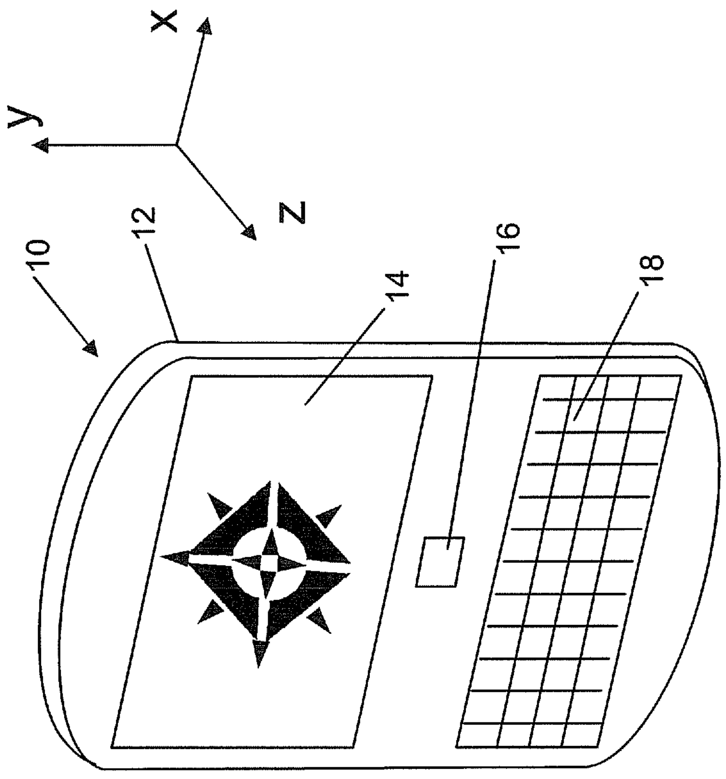
FIG. 1 is a perspective view of an example mobile device displaying an electronic compass.

It will be appreciated that for simplicity and clarity of illustration, where considered appropriate, reference numerals may be repeated among the figures to indicate corresponding or analogous elements. In addition, numerous specific details are set forth in order to provide a thorough understanding of the example embodiments described herein. However, it will be understood by those of ordinary skill in the art that the example embodiments described herein may be practised without these specific details. In other instances, well-known methods, procedures and components have not been described in detail so as not to obscure the example embodiments described herein. Also, the description is not to be considered as limiting the scope of the example embodiments described herein.

An exterior view of an example mobile device 10 is shown in FIG. 1 The mobile device 10 in this example comprises a housing 12 which supports a display 14, a positioning device 16 (e.g. track pad, track wheel, etc.), and a keyboard 18. The keyboard 18 may comprise a full-Qwerty (as shown) set of keys but may also provide a reduced Qwerty set of keys (not shown) in other embodiments. It can be appreciated that the mobile device 10 shown in FIG. 1 is provided as an example for illustrative purposes only. For example, other mobile devices 10, may comprise a touchscreen display 14 and a "slide-out" keyboard 18, where, in operation, the touchscreen display 14 can be used to interact with applications on the mobile device 10 and the keyboard 18 may be slid out from behind the touchscreen display 14, when desired, e.g. for typing or composing an email, editing a document, etc. Other example embodiments of a mobile device 10, may include a foldable or flippable housing 12, sometimes referred to as a "clamshell" type mechanism, to fold the display 14 towards the keyboard 18, to effectively transition the mobile device 10 between an operable or open state and a standby or closed state.

Figure 2:
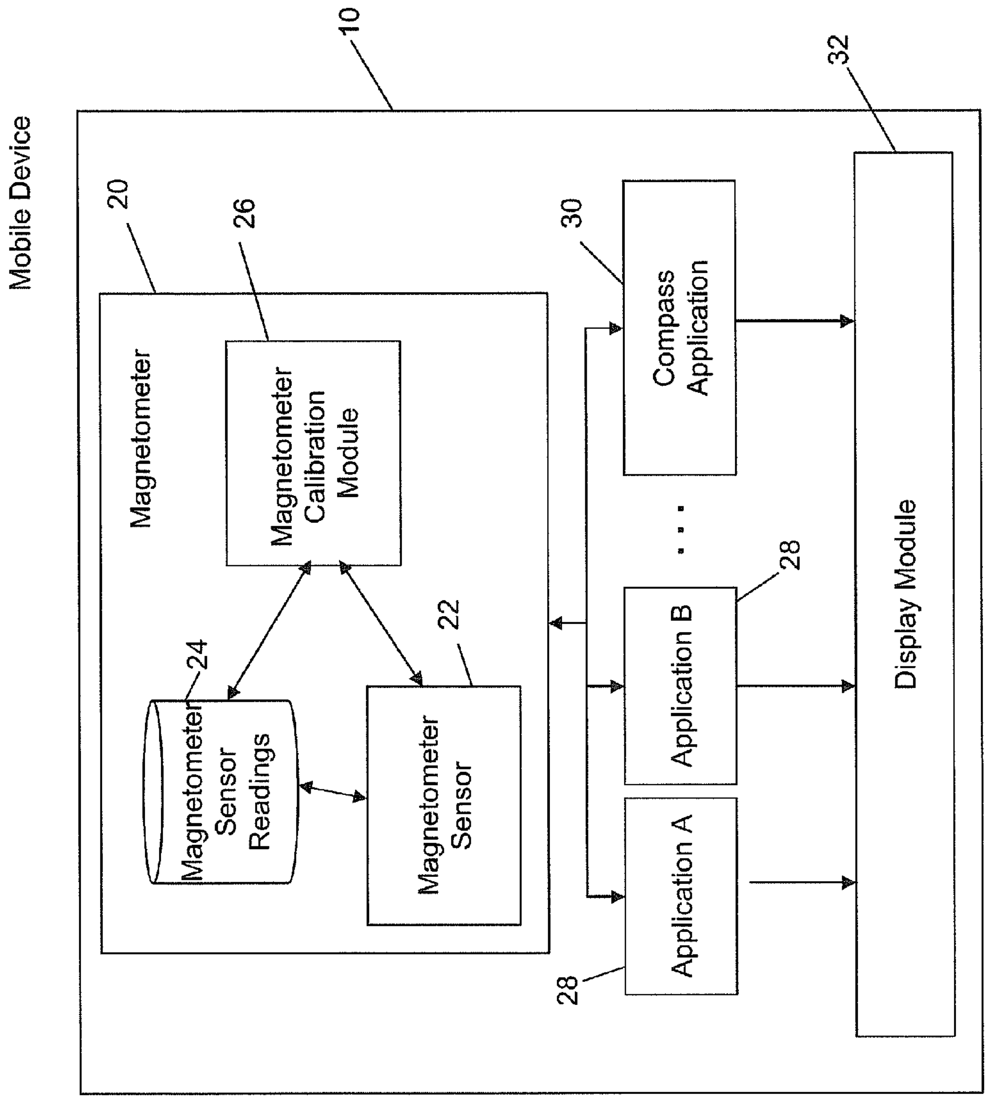
FIG. 2 is a block diagram of an example configuration for a mobile device comprising a magnetometer calibration module.

An example configuration for a mobile device 10 comprising a magnetometer 20 is shown in FIG. 2. The magnetometer 20, when operable, obtains or otherwise acquires readings including the direction of the magnetic field, and its strength, using a magnetometer sensor 22. Such readings are stored in a magnetometer sensor readings data store 24. Changes in the environment in which the mobile device 10 operates can affect the operation of the magnetometer sensor 22. As such, the magnetometer 20 may need to be calibrated at certain times. A calibration may be performed, in this example embodiment, using a magnetometer calibration module 26. Various applications 28 may utilize the readings in the data store 24. In this example, a compass application 30 is shown specifically. It can be appreciated that the other applications 28 may include any application that can make use of magnetometer readings, for example, a stud finder application, metal detector application, augmented reality based application, etc. The applications 28, 30 may then use such readings to provide a user interface (UI) using a display module 32, e.g. a real-time compass showing the mobile device's heading as shown in FIG. 1. It can be appreciated that various components of the mobile device 10 are omitted from FIG. 2 for ease of illustration.

In operation, the magnetometer 20 typically determines quality measures for readings from the magnetometer sensor 22 as they are collected, and such quality measures are then associated with the corresponding data stored in the magnetometer sensor readings data store 24, to enable the magnetometer 20 to provide an indication of quality at the same time that it provides the magnetometer sensor reading itself. By applying quality indicators, the magnetometer calibration module 26 can detect whether or not a current magnetometer calibration (i.e. due to the last calibration performed on the magnetometer sensor 22) is of good or poor quality.

Figure 3:
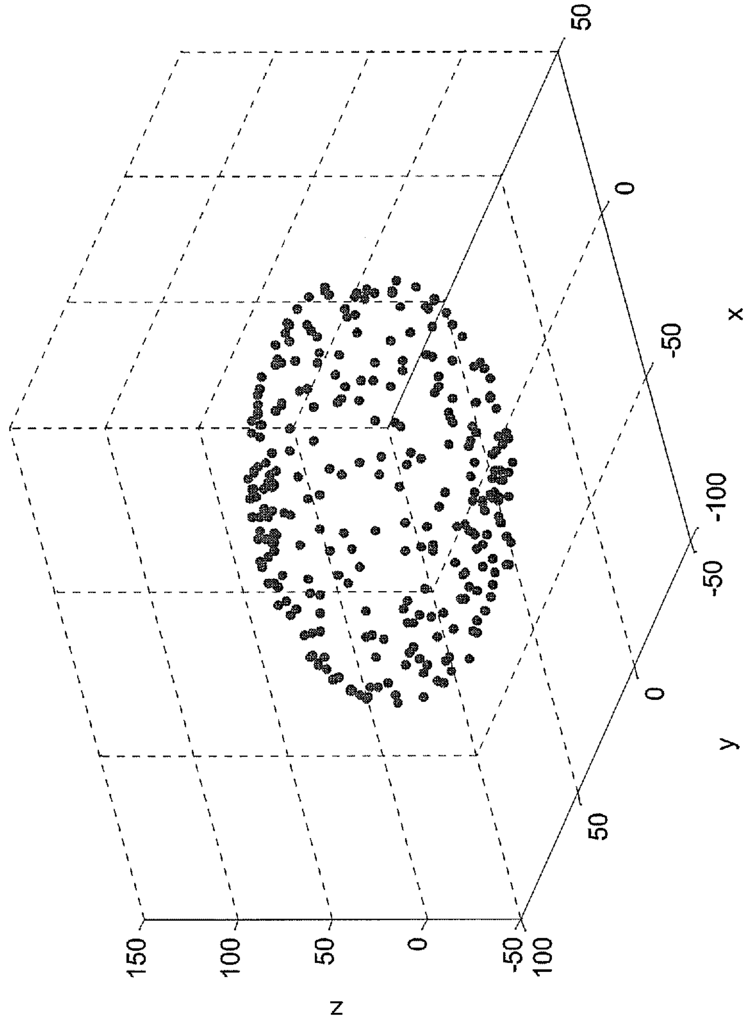
FIGS. 3 and 4 are data point graphs illustrating effects of applying a magnetometer calibration.
Figure 4:
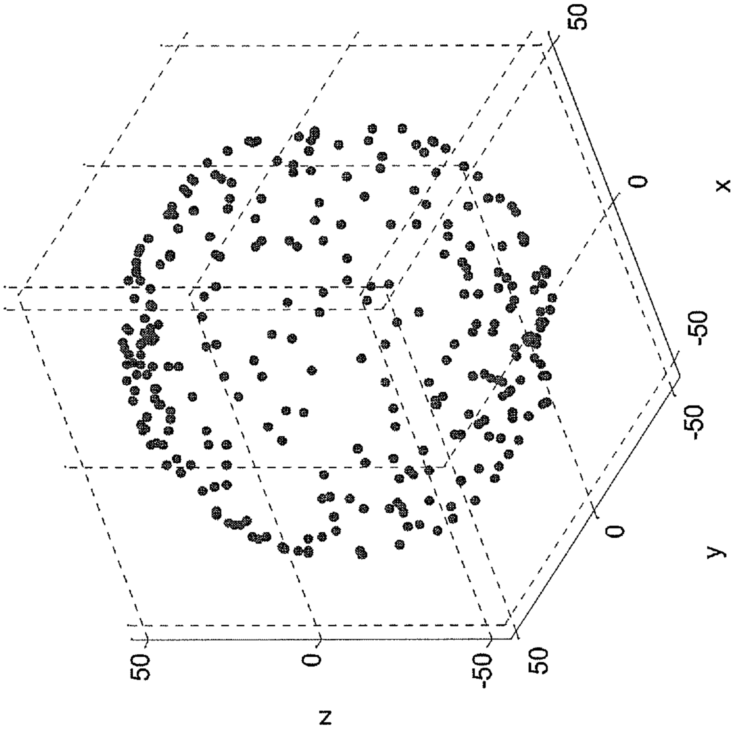

The quality indicators used for calibrating a three-axis magnetometer sensor 22 can be used separately by the magnetometer 20 to, in part, determine when to calibrate the magnetometer sensor 22. The magnetometer sensor 22 may be calibrated in various ways, including those calibration methods described later, for inaccuracies in gain (which can be different for each axis), DC offset (which can also be different for each axis), and inter-axis misalignment angles. DC offset refers to the steady state bias (i.e. offset) of sensor axes (e.g. 3 values, 1 per sensor axis for a 3-axis magnetometer). The DC offset is the sensor axes' measurement point of intersection origin, and the DC offset is usually is non-zero, as the DC offset typically has a bias due to the net effect of the hard iron inside the mobile device 10. As such, a calibration of the magnetometer sensor 22 can be performed to improve the accuracy of three calibration parameters, which may apply to each axis. Application of the calibration parameters enables the magnetometer sensor readings 24 to be improved, for example, to improve the shape of the magnetic field measured as shown in FIG. 3, which may appear to be an ellipsoid due to factors such as an unequal response between axes, such that the shape resembles a sphere as shown in FIG. 4. As discussed below, in some modes of operation, not all calibration parameters may be used. For example, a mobile device 10 may be operated having applied both a gain calibration and a DC offset calibration, or having applied only a DC offset calibration.

One type of calibration that may be performed by the magnetometer calibration module 26 is a calibration method that relies on movement of the mobile device 10 to obtain various readings. For example, the magnetometer calibration module 26 may be operable to display one or more instructions in a UI using the display module 32, to have a user participate in facilitating such movements. The movements associated with a magnetometer calibration method are often referred to as a "magnetometer calibration gesture" or "gesture", for short. A calibration method that involves such user interaction may be referred to as a "foreground" calibration.

It has been found that, in order to obtain a sufficient number of magnetometer readings to perform a foreground calibration, a desired path of movement of the mobile device 10 should be chosen that enables the calibration method to improve the magnetometer sensor's readings without requiring a lengthy calibration routine or onerous participation by the user (including frequent requests to re-calibrate). Such a path should be capable of orienting the mobile device 10 in such a way that readings can be obtained while the mobile device 10 is positioned such that the magnetometer sensor 22 can obtain readings comprising a range of values, for at least two axes.

Although various paths can be chosen to achieve the requisite number of positions, it can be difficult to instruct a user how to make the corresponding movements. For example, it has been found that instructing the user to move the mobile device 10 in a "Figure Eight" pattern can be insufficient. In particular, since a figure eight may be visualized as a two-dimensional pattern, it has been found that the user often performs the requested movements in a single plane, which has the effect of making it difficult to obtain a sufficient number of distinct readings, and may even fail to obtain both positive and negative readings along a single axis if, for example, the mobile device 10 is substantially facing magnetic north. Even if a calibration can be performed, the calibration may be of poor quality and repeated or frequent foreground calibrations are then required to maintain operability of an application 28 using the magnetometer 20.

In order to consistently obtain readings in both the positive and negative directions along two or more axes, a plurality of visual elements 34 can be used which represent at least a pair of movements. Each of the movements, when performed, have the mobile device oriented in substantially opposite positions, in an attempt to obtain a range of readings for one of the axes with respect to the device. By illustrating at least a pair of movements, at least two measurements can be obtained when the mobile device is oppositely directed, to acquire sufficient knowledge of the shape of magnetic field. In this way, the visual elements instruct the user in performing a series of movements that achieve such orientations. Magnetometer readings made during these movements may then be used to perform a foreground calibration that more efficiently calculates the necessary calibration parameters.

Figure 5:
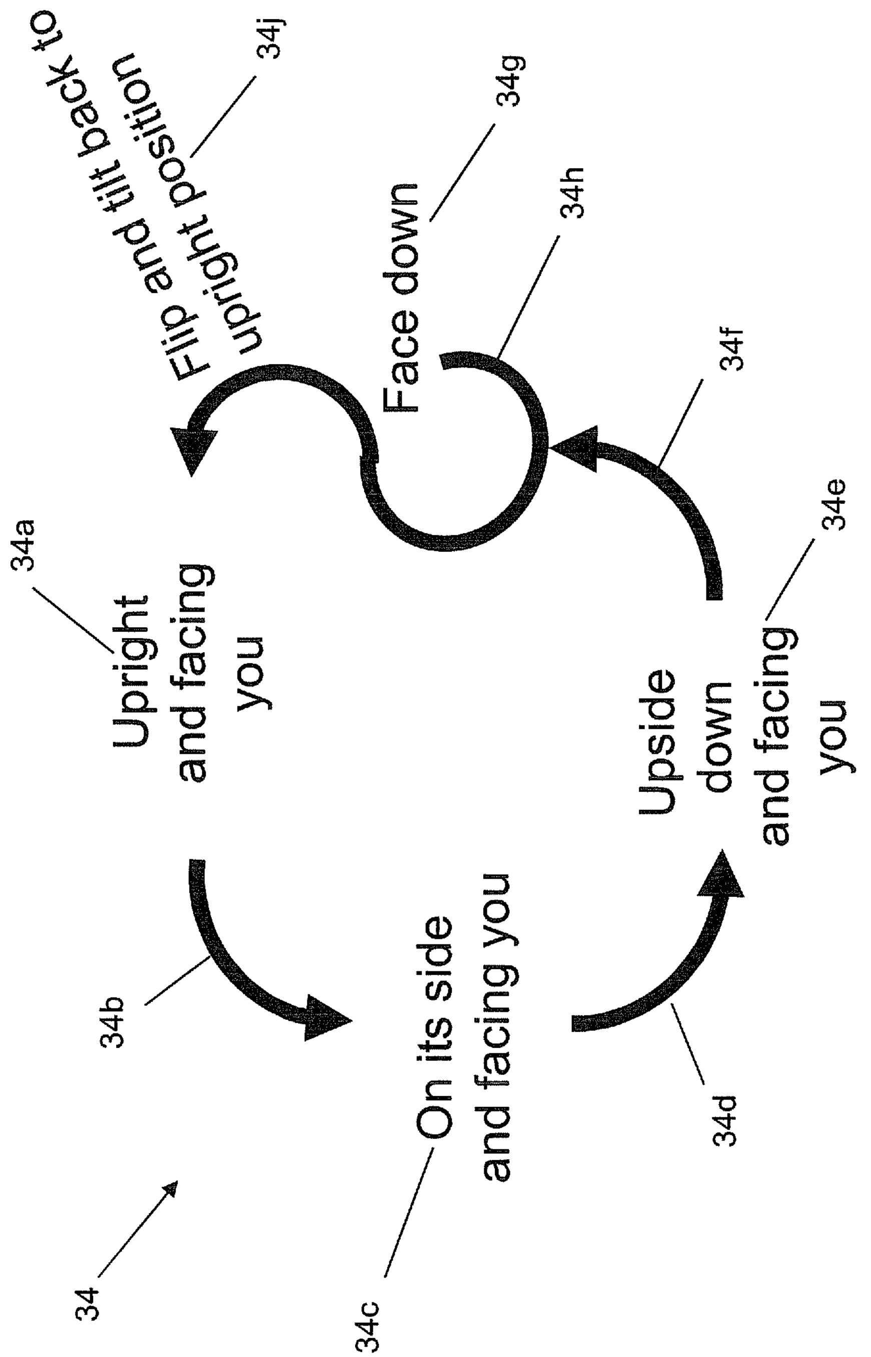
FIG. 5 is a set of visual elements for illustrating a series of movements to be executed during a foreground magnetometer calibration.

An example set of visual elements 34 is shown in FIG. 5. FIG. 5 illustrates textually an example path and series of orientations to be conveyed to a user, using the visual elements 34. The use of text in FIG. 5 is for illustrative purposes only and, as will be explained below, the visual elements 34 may comprise graphical elements such as icons, may comprise text (as shown in FIG. 5), or both (not shown). It has been found that in order to have a pair of movements that each orient the mobile device 10 in substantially opposite positions, a first movement comprising a tilt or rotation of the mobile device 10 about one axis between opposite orientations, followed by a second movement that at least in part comprises a rotation and/or flip of the mobile device 10 about another axis, can be displayed by the mobile device 10, as shown in FIG. 5. Such a pair of movements thus enables a range of values for at least two axes to be obtained for calibrating a magnetometer. It has also been found that by illustrating the mobile device 10 as it would appear to the user in each of a series of positions, using graphics, and defining a path using arrows between each of the graphics, further guidance and clarity in the desired movements can be depicted.

A first of the example movements shown in FIG. 5 comprises displaying a first visual element 34*a* indicating that the mobile device 10 should be upright and facing the user, followed by a second visual element 34*b* illustrating a tilt or rotation of the mobile device 10 using an arrow, such that the mobile device 10 is oriented to be on one side or "sideways" and facing the user, as shown by a third visual element 34*c*. A fourth visual element 34*d* in this example comprises a second arrow which illustrates further tilting or rotation of the mobile device 10 about the same axis such that the mobile device 10 is upside down and facing the user as conveyed using a fifth visual element 34*e*.

It can be appreciated that in this example embodiment, "upright" refers to a positioning or orientation wherein the display 14 of the mobile device 10 is above the keyboard 18 and substantially aligned with the Y axis as shown in FIG. 1, and "facing the user" refers to a positioning or orientation wherein the display 14 is facing the user, e.g., wherein the display 14 is directed substantially along the positive Z direction shown in FIG. 1. Similarly, in this example embodiment, "on one side" and "sideways" refer to a positioning or orientation wherein the mobile device 10 has been rotated about the Z axis shown in FIG. 1 approximately 90 degrees with respect to the upright position, and "upside down" refers to a positioning or orientation wherein the mobile device 10 has been rotated about the Z axis shown in FIG. 1 approximately 180 degrees with respect to the upright position.

A second of the example movements shown in FIG. 5 may comprise displaying a sixth visual element 34*f* illustrating further rotation of the mobile device 10 towards a face down orientation shown using a seventh visual element 34*g*. The second of the movements may then continue by illustrating a flip or rotation about an axis along the length of the mobile device 10 using an eighth visual element 34*h* comprising an "S" shaped arrow. In this example embodiment, a ninth visual element 34*j* may also be used to further guide the user towards returning to an orientation illustrated by the first visual element 34*a*.

It can be appreciated that in this example embodiment, "face down" refers to a positioning or orientation wherein the display 14 is directed towards the ground or floor, i.e. substantially facing the negative Y direction according to what is shown in FIG. 1.

It can be appreciated that the example movements and orientations depicted in FIG. 5 are for illustrative purposes only. For example, the visual elements 34 could instead instruct or otherwise depict orientations of the mobile device 10 wherein the mobile device 10 is facing away (i.e. the display 14 facing substantially the negative Z direction as in FIG. 1) from the user in the first movement (34*a* through 34*e*) and facing upwardly (i.e. the display 14 facing substantially the positive Y direction as in FIG. 1) in visual element 34*g*. It can also be appreciated that by using graphical elements representing how the mobile device 10 may appear to the user can reduce the number of visual elements 34 needed to illustrate the movements. For example, a comparison of the orientations shown at 34*g* versus 34*a* using graphical elements showing how the mobile device 10 may look can eliminate the need to provide the ninth visual element 34*j*.

Figure 6:
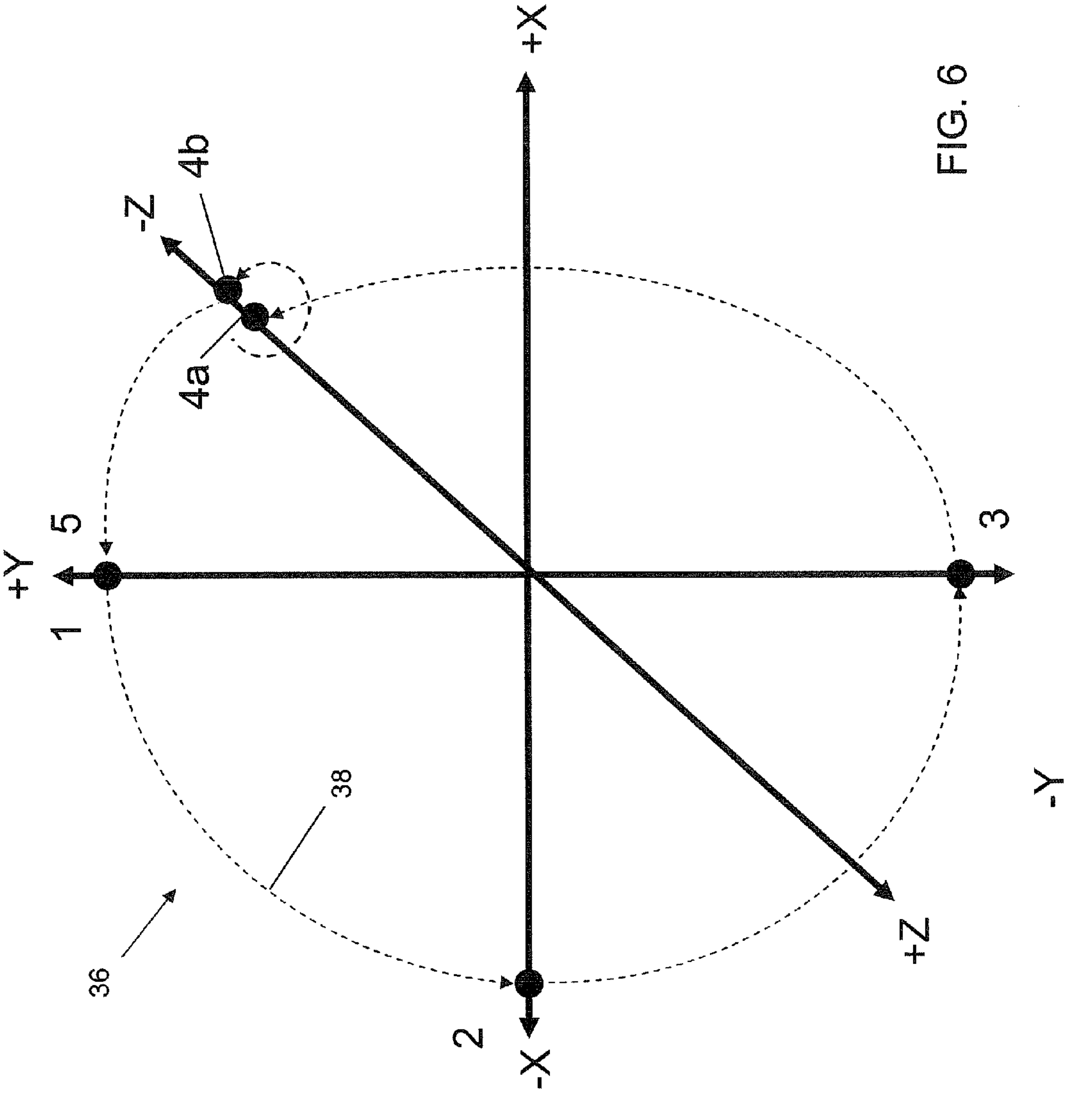
FIG. 6 illustrates a path of movements during a foreground magnetometer calibration with respect to a set of axes.

The movements made according to the visual elements 34 shown in the example embodiment illustrated in FIG. 5 can be visualized in three dimensions as shown in FIG. 6. In FIG. 6, a plot 36 is shown according to the relative coordinate system shown in FIG. 1, to illustrate movement of the magnetometer 20 during the movements requested using the plurality of visual elements 34. In the example embodiment shown in FIG. 6, the black dots represent the position of the magnetometer at each orientation depicted using the visual elements 34, and the dashed line illustrates a path 38 defined by the movements.

At orientation (1) in FIG. 6, when the mobile device 10 is upright and the display 14 is facing the +Z direction, the magnetometer sensor 22 can obtain a reading (X, Y, Z) that is substantially (0, +MAX, SMALL), where +MAX refers to a substantially maximum reading along the Y axis in the positive (+) direction, and SMALL refers to an expected slight reading along the Z axis (either positive or negative direction) due to an imperfect "upright" positioning. For example, the user may have the mobile device 10 slightly tilted towards or away from the user in order to read the display 14. It can be appreciated that in an ideal reading, the SMALL reading in the Z direction would approach zero (0). It can also be appreciated that a SMALL reading may be present in the X direction, for the same reasons as in the Z direction.

The path 38 arcs between orientation (1) and orientation (2), wherein the mobile device 10 is meant to be sideways or otherwise on its side, i.e. rotated approximately 90 degrees about an axis passing through the display 14, with respect to orientation (1). The magnetometer sensor 22 obtains a reading (X, Y, Z) in orientation (2) that is ideally (−MAX, 0, 0), where −MAX refers to a substantially maximum reading along the X axis in the negative (−) direction. Similar to orientation (1), at orientation (2), one or more of the Y reading and the Z reading may be SMALL, due to imperfect positioning. The path 38 continues the arc in completing the first movement to orientation (3), wherein the mobile device 10 is meant to be upside down with respect to the position shown in association with orientation (1), i.e. rotated approximately 180 degrees about an axis passing through the display 14, with respect to orientation (1). The magnetometer sensor 22 obtains a reading (X, Y, Z) in orientation (3) that is ideally (0, −MAX, 0), wherein −MAX refers to a substantially maximum reading along the Y axis in the negative (−) direction. Similar to orientations (1) and (2), at orientation (3), one or more of the X reading and the Z reading may be SMALL, due to imperfect positioning. It can be appreciated that completion of the first movement between orientations (1) and (3) encourages readings in the X direction that range from zero to −X (or +X if tilted the other way or with opposite coordinate system). By including orientation (2), the rotation about a single axis (Z in this example) is further clarified to avoid extraneous rotations that minimize the changes in X readings. For example, a movement between orientation (1) and orientation (3), without including an orientation (2) with the mobile device 10 facing the same direction, could result in transitions from topside up to face down, to top down, to face up, which would not achieve the same range of readings for X.

It can be appreciated that during movement of the mobile device 10 according to the path 38, the first of the at least a pair of movements comprises a rotation of the mobile device 10 about the Z axis from orientation (1), to orientation (2), to orientation (3), while the display 14 of the mobile device 10 faces the positive Z direction, in order to obtain a range of values for the X axis.

The second movement in this example embodiment begins by having the mobile device 10 positioned in orientation (4*a*), wherein the mobile device 10 is meant to be facing downwardly, i.e. the display 14 facing substantially towards the ground or floor. It can be appreciated that the path 38 shown in FIG. 6 arcs towards a point ideally on the Z axis to thereby obtain a maximum reading along Z axis. In this example, the magnetometer sensor 22 obtains a reading (X, Y, Z) in orientation (4*a*) that is ideally (0, 0, −MAX), where −MAX refers to a substantially maximum reading along the Z axis in the negative (−) direction. Similar to orientations (1), (2), and (3), at orientation (4*a*), one or more of the X reading and the Y reading may be SMALL, due to imperfect positioning.

The second movement continues by having the mobile device 10 rotated or "flipped" substantially about its Z axis while tilting or rotating substantially about the X axis to orientation (5), which is meant to be substantially the same as orientation (1). It can be appreciated from FIG. 6 that the path 38 from orientation (4*a*) to orientation (5) includes an intermediate orientation (4*b*), wherein the mobile device 10 has been re-oriented such that the display 14 is facing upwardly, i.e. oppositely facing with respect to the positioning or orientation of the mobile device 10 in orientation (4*a*). At orientation (4*b*), the magnetometer sensor 22 obtains a reading (X, Y, Z) that is ideally (0, 0, +MAX), where +MAX refers to a substantially maximum reading along the Z axis in the positive (+) direction. Similar to orientations (1), (2), (3), and (4*a*), at orientation (4*b*), one or more of the X reading and the Y reading may be SMALL, due to imperfect positioning.

It has been recognized that the path 38 between orientations (4*a*) and (5), namely by having the orientation of the mobile device 10 return to an upright position facing the user, encourages readings in the Z direction that range from zero or −Z to +Z. By obtaining both the positive and negative readings, the likelihood of crossing the origin of the ellipsoid is increased.

The second of the movements according to the path 38 thus includes a rotation of the mobile device 10 about the Z axis when the Z axis is aligned along the length of the mobile device 10, beginning with the display 14 of the mobile device facing downwardly, i.e. facing substantially towards the floor or ground along the negative Y direction at orientation (4*a*), and returning to orientation (1). During such a movement, the mobile device 10 is oppositely positioned by the mobile device 10 to obtain a range of values in the Z direction by being turned over to have the display 14 tilted back towards the user in order to return the mobile device 10 to a position facing the user, when the mobile device 10 is aligned in the upright position again. It can be appreciated that by having the second movement performed in such a way, the opposite positioning of the mobile device 10 at orientation 4(*b*), with respect to orientation 4(*a*), can be inherently achieved. In other words, in order to perform the movement depicted using visual elements 34*g*, 34*h* and 34*j* on a portion of the path 38 returning to the orientation depicted in visual element 34*a*, the mobile device 10 is inherently orientated in a position opposite the position depicted using visual element 34*g* to thereby obtain the range of readings in the Z direction.

The path 38 not only positions the mobile device 10 in opposite directions to enable a range of readings for at least two axes, but also facilitates a determination of how closely the magnetometer readings are to lying on a sphere. In this example embodiment, the path 38 from orientation (1) to orientation (3) obtains a portion of the sphere representing the magnetic field, which may be envisioned as a three-dimensional slice such as a segment of an orange. Additional portions of the sphere are also obtained along the path 38 from orientation (3) to orientation (4*a*) and from orientation (4*b*) to orientation (5). It can be appreciated that the portions of the sphere obtained between (1) and (3) and (4*a*) to (4*b*) would each define approximately ½ of the shape, whereas the portions obtained between (3) to (4*a*) and between (4*b*) to (5) would define approximately ¼ of the shape respectively.

By instructing the user to repeat the movements according to the visual elements 34, the magnetometer sensor 22 can repeatedly follow the path 38 shown in FIG. 6 until a sufficient number of distinct readings are obtained to calculate new calibration parameters, as discussed by way of example below.

As discussed above, the visual elements 34 may include a series of graphics that depict the way in which the mobile device 10 may appear to the user in the various orientations. FIG. 7 illustrates an example embodiment wherein, generally, each graphic comprises one or more identifying characteristics that enable the user to distinguish between an upper (U) portion 42 and a lower (L) portion 44 thus enabling an upright orientation to be distinguished from an upside down orientation. The identifying characteristics should also make it possible to distinguish between the mobile device 10 facing towards and away from the user. Similarly, either by way of an alteration of the shape of the graphic, or another identifying characteristic, a rear face or "back" (B) of the mobile device 10 is shown to demonstrate the fourth orientation (at 34*g* in this example). In this way, the graphic can be chosen such that the particular mobile device 10 and the look and feel of the mobile device 10 can be conveyed through the graphic (and/or alterations thereto) to further guide the user in making the requested movements.

It can be appreciated that various identifying characteristic can be used to enable the orientations of the mobile device 10 to be distinguished from each other. For example, FIG. 8A illustrates a visual element 34 including a circular element 48 depicting a camera, e.g. in embodiments wherein the mobile device 10 is upright when the camera is at the top of the mobile device 10 and the display 14 covers a majority of the front face of the mobile device 10. In FIG. 8A, another example is shown, wherein the visual element 34 depicts a screen or display element 50, e.g. in embodiments wherein the mobile device 10 is upright when the display 14 is oriented at the top of the mobile device 10. FIG. 8C illustrates yet another example, wherein a logo 52 is used to demonstrate both the upright orientation and which way is "facing" the user, e.g., wherein the mobile device 10 includes a clamshell type body 12. It can be appreciated that similar or different identifying characteristics can also be used to depict a face down orientation such that the back face of the mobile device 10 is facing upwardly. For example, a rear facing camera, logo, or other visual feature may be depicted in visual element 34*g*.

Figure 9:
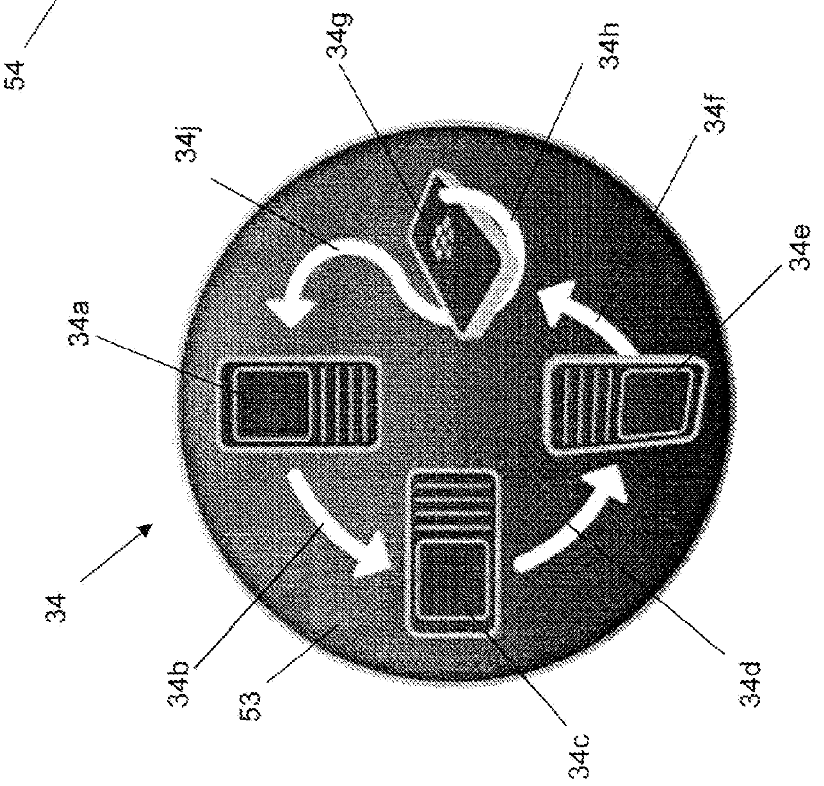
FIG. 9 illustrates a graphic including a set of visual elements for illustrating a series of movements to be executed during a foreground magnetometer calibration.

FIG. 9 illustrates an example graphic 53 that includes the plurality of visual elements 34. In this example graphic 53, it can be seen that the visual elements 34*a*, 34*c*, 34*e*, at the first three orientations depict the relative positioning of the display 14 of the mobile device 10, and the visual element 349 at the fourth orientation shown depicts a logo 52 on the rear face or back of the mobile device 10.

Figure 10:
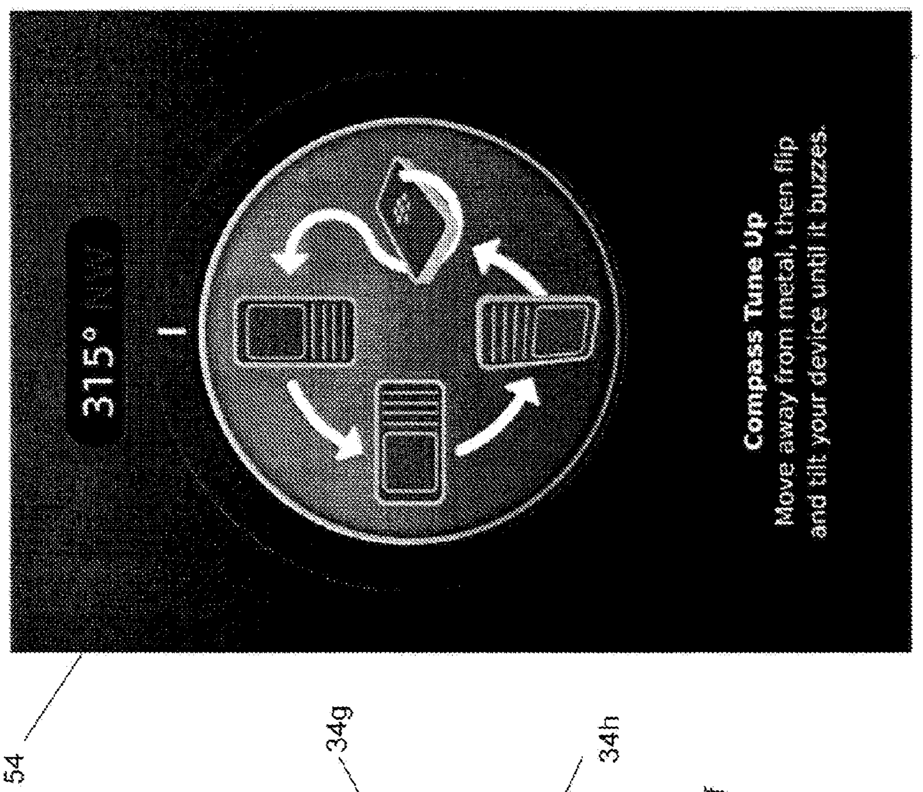
FIG. 10 illustrates a screen shot of an example user interface (UI) for providing a graphic including a set of visual elements for illustrating a series of movements to be executed during a foreground magnetometer calibration.

FIG. 10 illustrates a screen shot of an example compass calibration UI 54. In this example UI 54, a heading 58 is displayed with the graphic 53 shown in FIG. 9. In addition to the graphic 53, an instruction 56 is also displayed to advise the user of the initiation of the foreground calibration, and generally what are the movements shown in the graphic 53.

Figure 11:
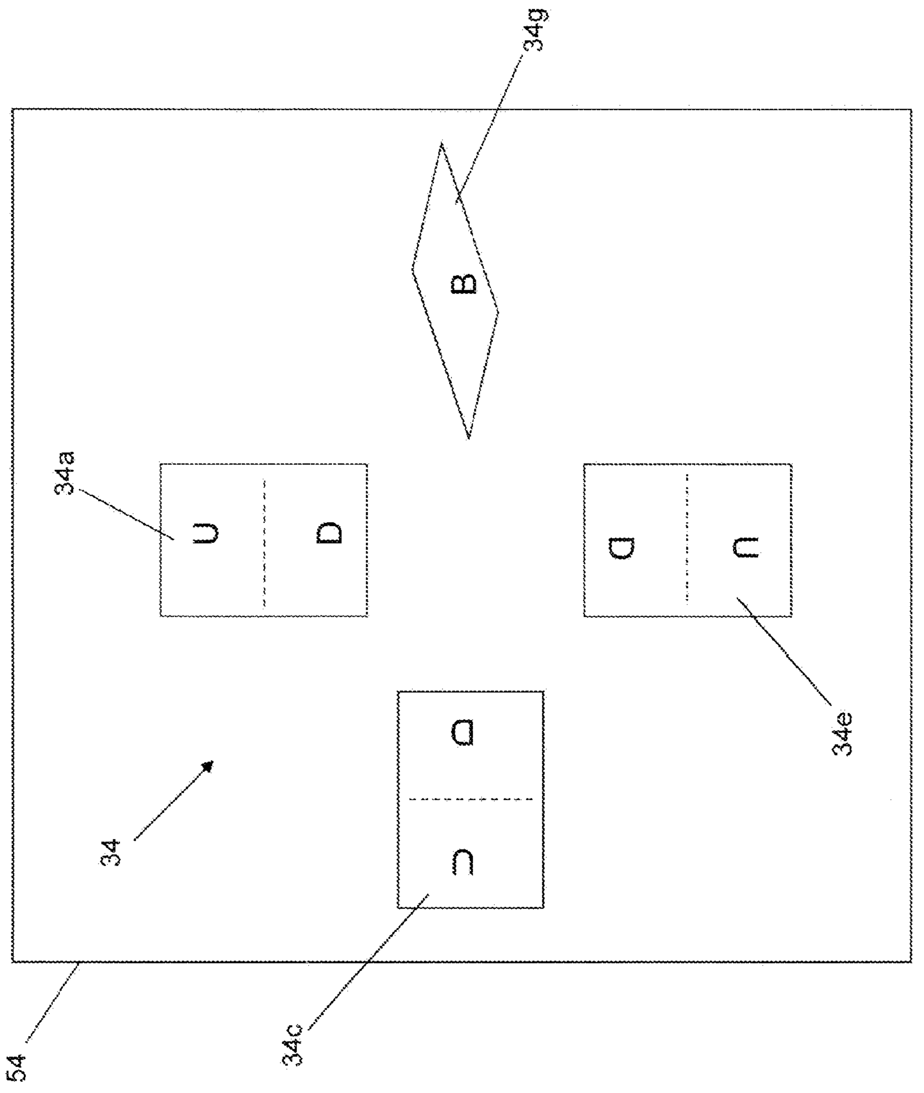
FIG. 11 illustrates a screen shot of an example UI for providing a set of visual elements for illustrating a series of movements to be executed during a foreground magnetometer calibration.
Figure 12:
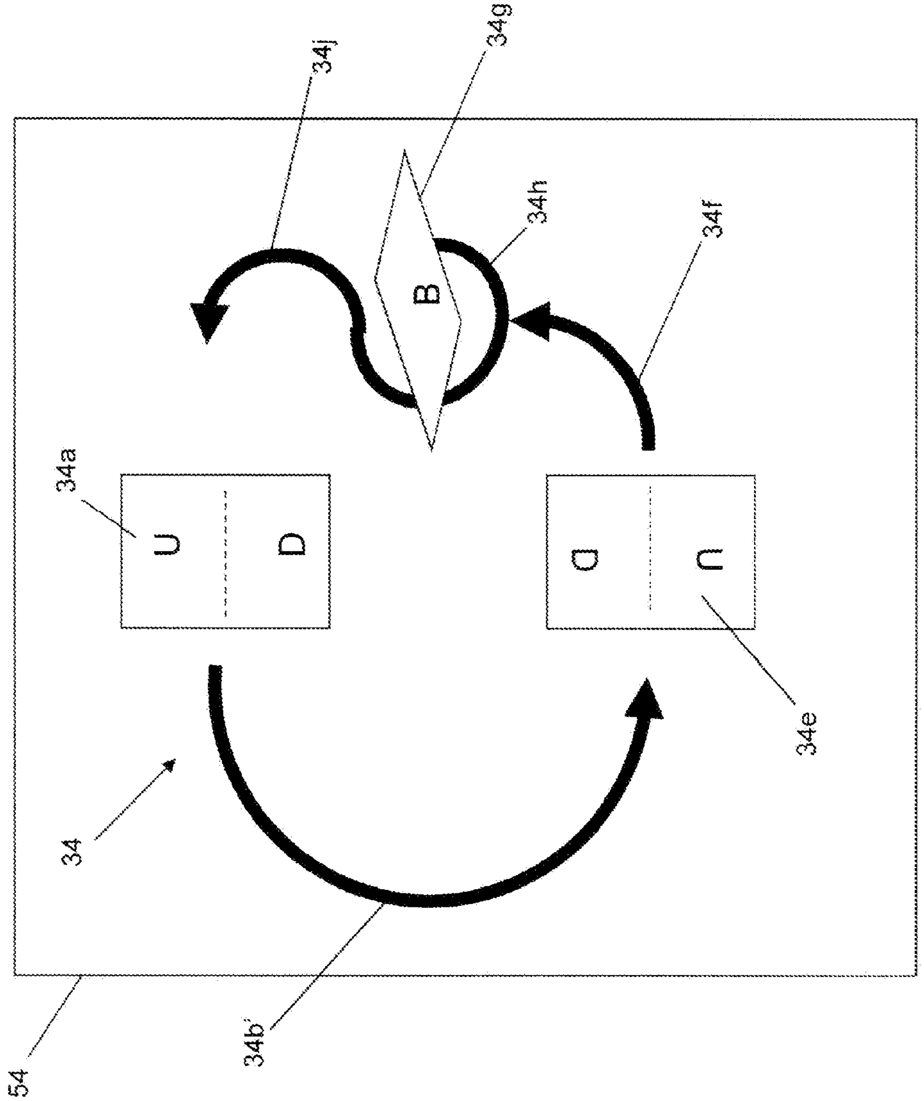
FIG. 12 illustrates a screen shot of an example UI for providing a set of visual elements for illustrating a series of movements to be executed during a foreground magnetometer calibration.
Figure 14:
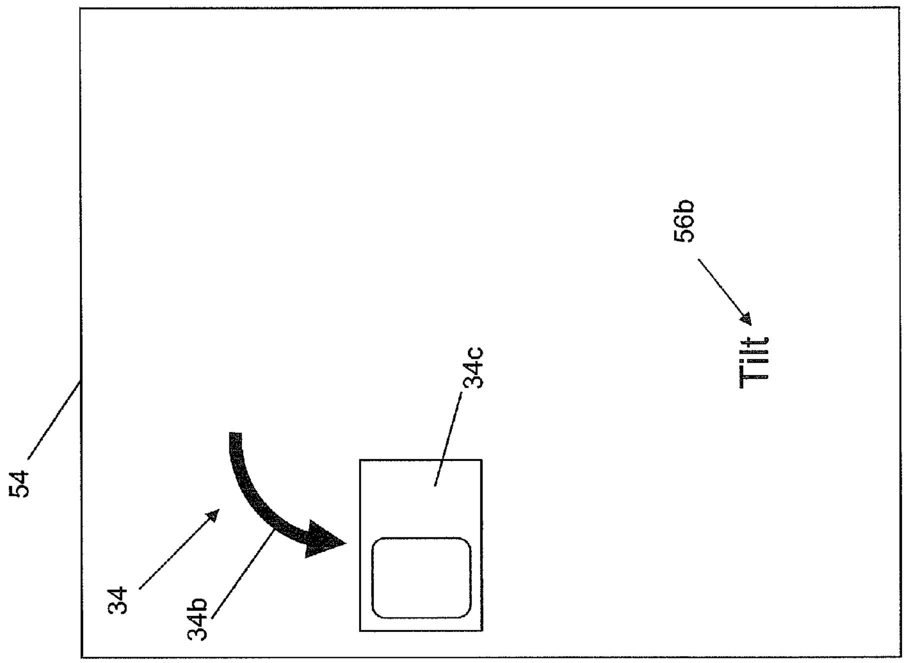
FIGS. 13 to 18 illustrate a series of screen shots of example UIs for providing a set of visual elements for illustrating a series of movements to be executed during a foreground magnetometer calibration one at a time.
Figure 13:
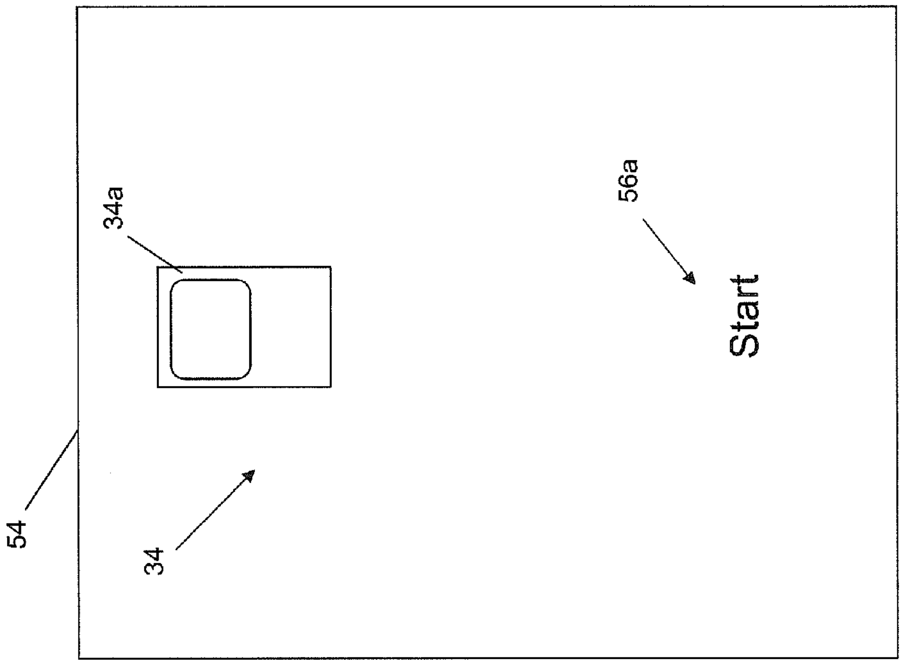
Figure 16:
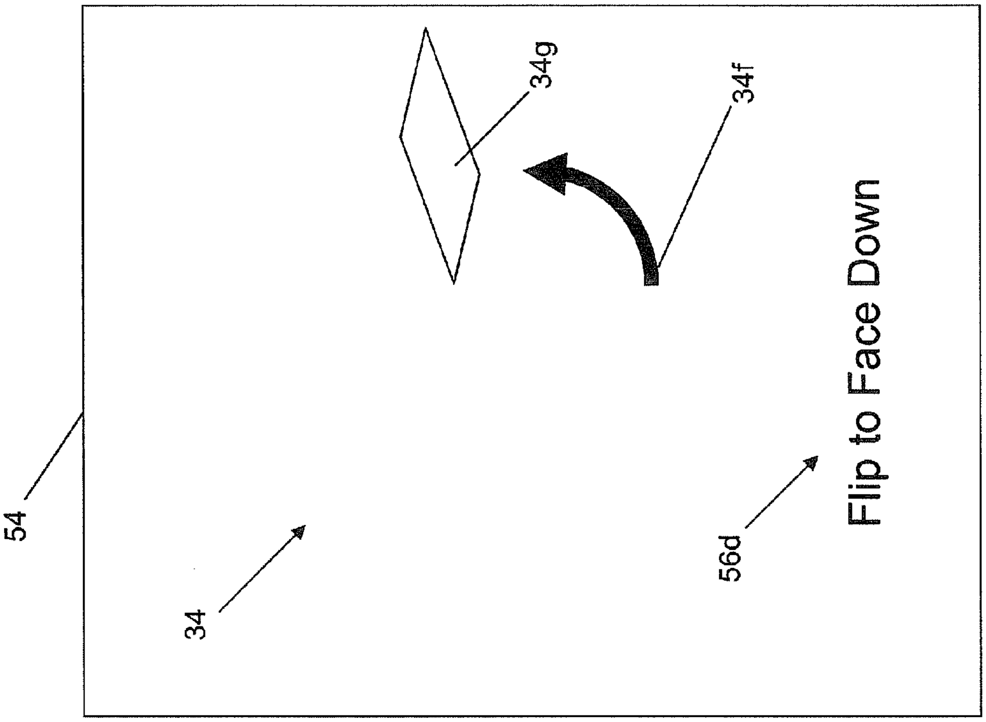
Figure 15:
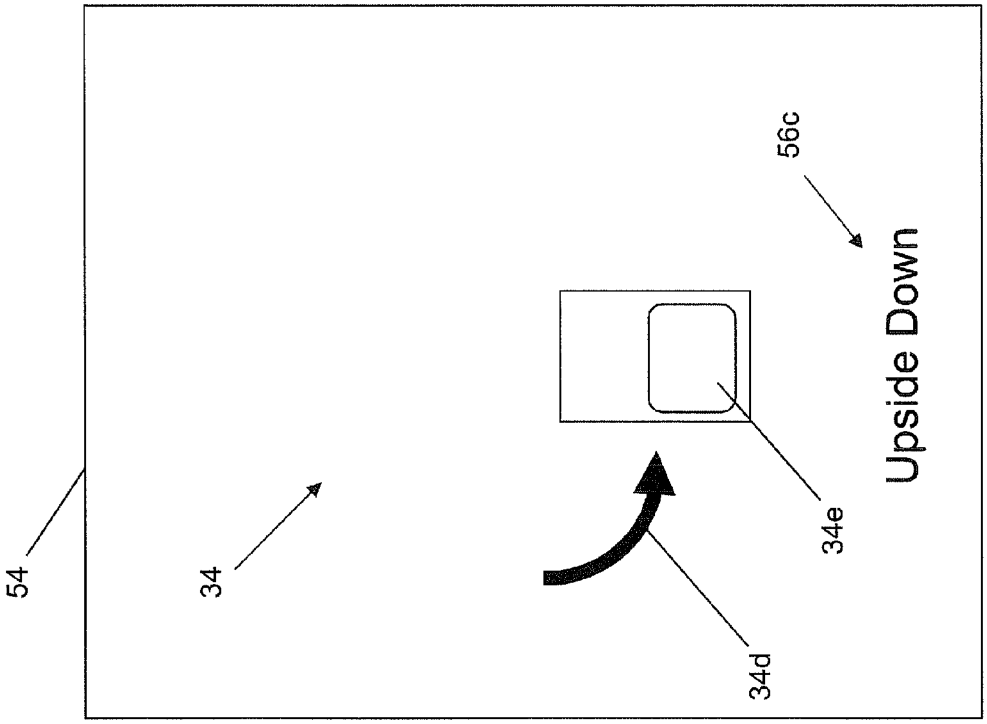
Figure 18:
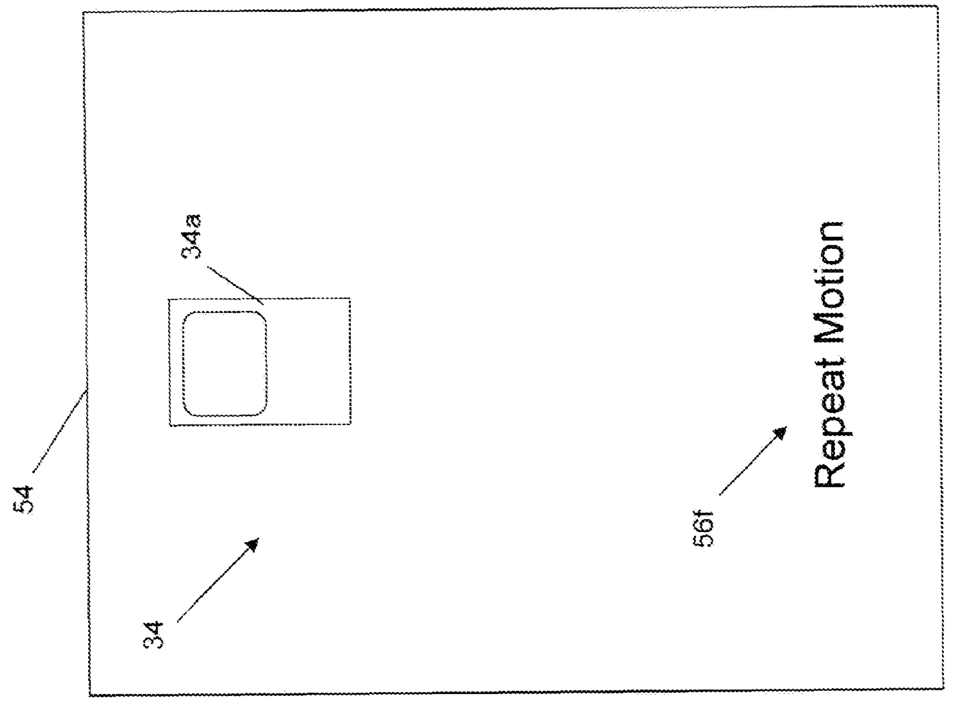
Figure 17:
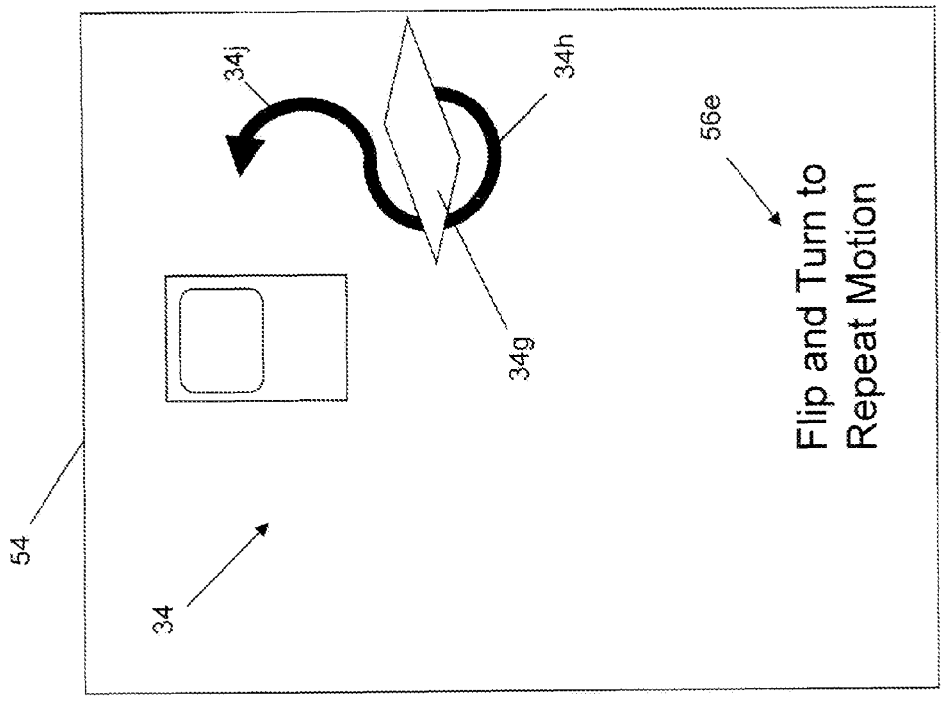

It can be appreciated that the number of visual elements 34 displayed, and whether or not arrows, text, or other accompanying elements are used, can vary. For example, as shown in FIG. 11, the visual elements 34 may comprise only the graphical depictions of the various orientations. In another example, shown in FIG. 12, the intermediate orientation (2) is omitted with the first movement therefore being illustrated using only upright and upside down graphical depictions. It can be seen in FIG. 12 that by enlarging the arrow between visual elements 34*a* and 34*e* (as shown in 34*b*'), the tilt or rotation movement can be illustrated using fewer visual elements 34.

It can also be appreciated that the plurality of visual elements 34 ran be displayed using a plurality of screens, as shown in FIGS. 13 to 18. In the example embodiment shown in FIGS. 13 to 18, the first visual element 34*a* and a first textual description 56*a* are displayed in a first screen of the U154 (FIG. 13), the second and third visual elements 34*b*, 34*c* and a second textual description 56*b* are displayed in a second screen of the UI 54 (FIG. 14), the fourth and fifth visual elements 34*d*, 34*e* and a third textual description 56*c* are displayed in a third screen of the UI 54 (FIG. 15), the sixth and seventh visual elements 34*f*, 34*g* and a fourth textual description 56*d* are displayed in a fourth screen of the U154 (FIG. 16), seventh, eighth and ninth visual elements 34*g*, 34*h* and 34*j* and a fifth textual description 56*e* are displayed in a fifth screen of the UI 54 (FIG. 17), and a sixth and final screen of the U154 illustrates the first visual element 34*a* again, along with a sixth textual description 56*f*.

It can be seen in FIGS. 13 to 18, that further guidance in executing the movements can be provided by animating the gesture. In some embodiments, an animation of the gesture can be displayed in a first iteration of the gesture, and a single screen with all visual elements 34 displayed thereafter until the calibration is complete. In such embodiments, a "learning" mode is therefore provided. It can be appreciated that a prompt or other input mechanism (not shown) can also be used to enable the user to selectively turn on or off the learning mode. For example, the animation shown in FIGS. 13 to 18 could be repeated until the magnetometer calibration module 26 detects selection of an option to stop the animation and revert to the single graphic 53 including all visual elements 34.

Figure 19:
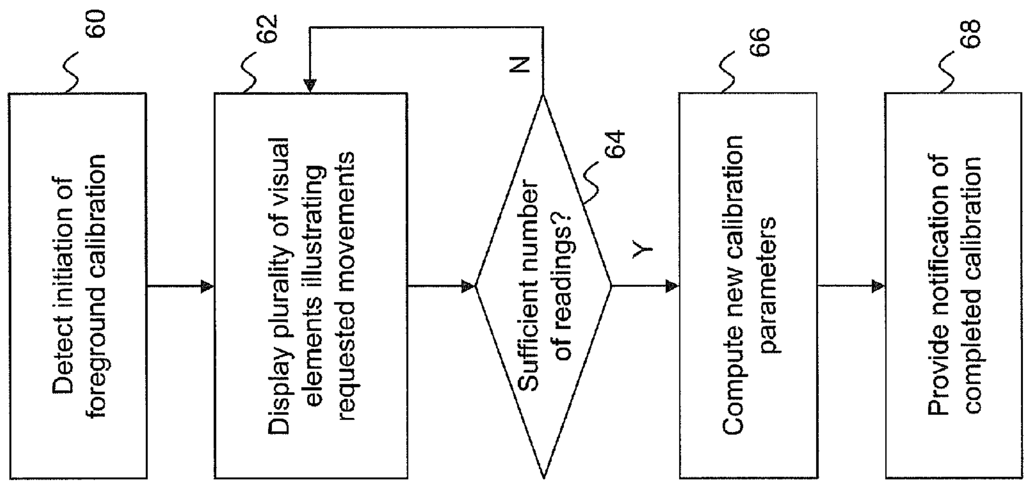
FIG. 19 is a flow chart comprising an example set of computer executable operations that may be executed to obtain magnetometer readings for performing a magnetometer calibration.

Turning now to FIG. 19, and example set of computer executable operations is shown, which utilize the plurality of visual elements 34 to facilitate obtaining magnetometer readings to be used in computing calibration parameters. At 60, the magnetometer calibration module 26 detects initiation of a foreground calibration. For example, the user may request such a calibration upon detecting poor quality measurements while using a digital compass, the magnetometer calibration module 26 may request such a foreground calibration. After initiating the foreground calibration module, the magnetometer calibration module 26 instructs and guides the user in performing movements to facilitate obtaining magnetometer readings by displaying the plurality of visual elements 34 illustrating the requested movements at 62. It may be noted that displaying the plurality of visual elements 34 at 62 may include displaying a single graphic 53, a series of screens of UI 54, or a combination of both, as described above.

The foreground calibration, during execution, and while displaying the plurality of visual elements 34, includes a determination at 64, of whether or not a sufficient number of readings have been obtained in order to compute new calibration parameters at 66. An example of such a determination is provided below. After determining that a sufficient number of readings have been obtained, the new calibration parameters may be computed at 66, and a notification of a completed calibration can be provided at 68. The notification provided at 68 can include any one or more of: a visual alert such as an LED or camera flash, a screen flash, replacement of the graphic 53 with another graphic or textual message; an audible alert, such as a tone, beep, series of tones or beeps, etc.; and a haptic or tactile alert, such as a vibration. It can be appreciated that the notification of a completed calibration may also be provided by simply removing the visual elements 34 (e.g. graphic 53) and returning to the application 28, 30, homescreen or other UI that was being used prior to initiation of the foreground calibration.

Figure 20:
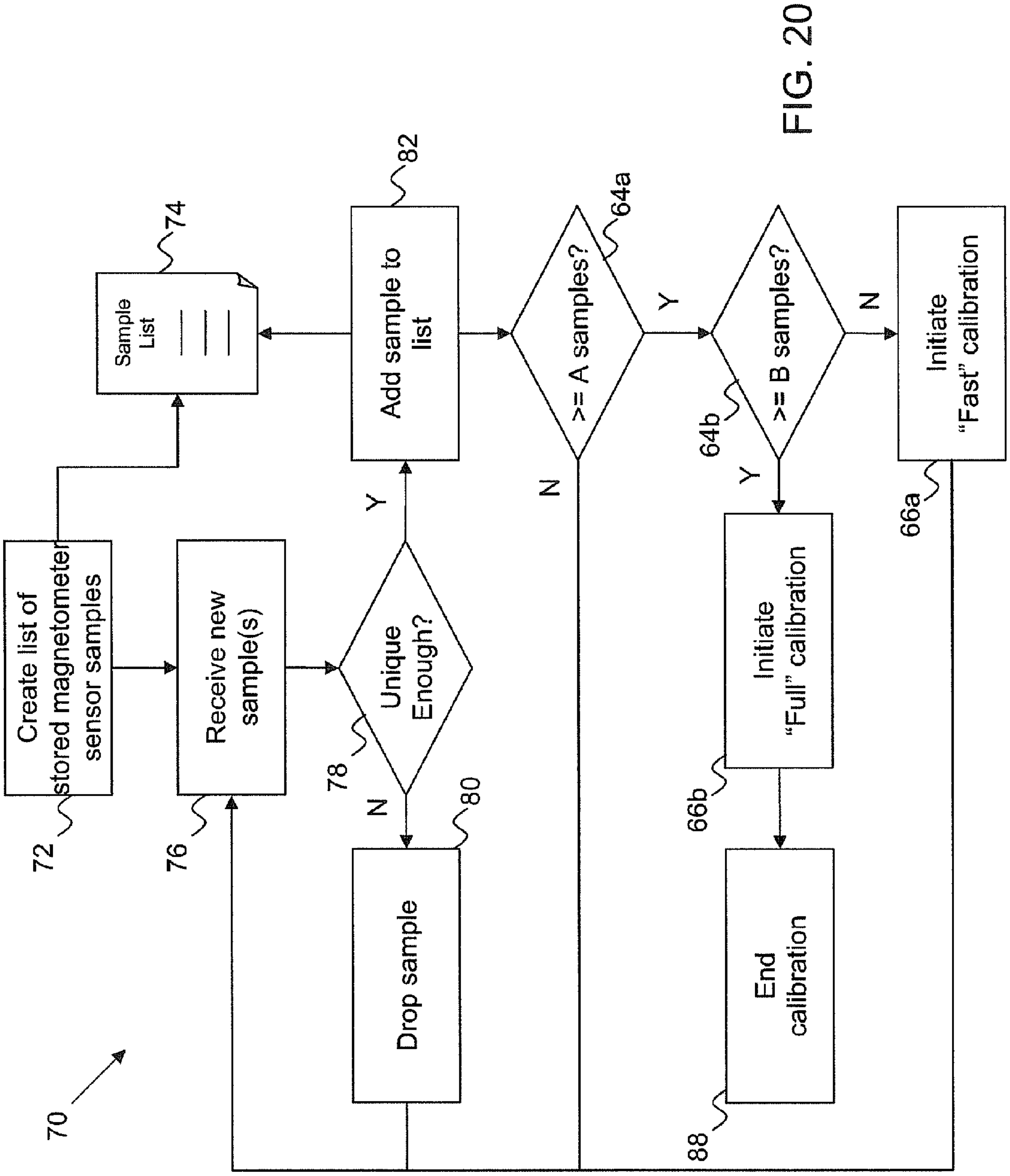
FIG. 20 is a flow chart comprising an example set of computer executable operations for performing a foreground magnetometer calibration method.

An example set of computer executable operations for performing a foreground calibration 70 is shown in FIG. 20. In this example, the foreground calibration 70 has three states, namely: UNCALIBRATED, UNCALIBRATED_DCO, and CALIBRATED. At 72, a list 74 of stored magnetometer sensor samples is created. Initially, the list 74 is empty and the foreground calibration 70 enters the UNCALIBRATED state. The magnetometer calibration module 26 then receives one or more new samples at 76. As these new samples arrive, they are compared at 78 with those samples already stored in the list 74 to determine if the new samples are unique enough. Any new sample which is deemed to be too similar to any of the previously stored samples is thus dropped at 80. There are various ways to determine whether or not the received sample is "too close" or "not unique enough". For example, a simple way is to drop samples which are identical to one or more previously stored samples. To provide improved performance, other metrics can be used such as the minimum Euclidean distance between the new sample and every previously-stored sample. If the minimum Euclidean distance is above a threshold, the newly arrived sample may be deemed "sufficiently different or unique" and added to the list 74 at 82.

The magnetometer calibration module 26 then determines at 64*a* and 64*b* if enough samples have been accumulated in order to initiate the fast calibration at 66*a*. As will be explained in greater detail below, the fast calibration 66*a* can be used to correct DC offset only, which is faster than performing a calibration of all three parameters and can be used to assist in increasing the number of samples in the list 74. In FIG. 20 it can be seen that between A and B samples are required to initiate the fast calibration at 66*a*. The number of samples represented by A and B may be chosen according to the techniques used in the fast and full calibrations. For example, as explained below, the fast and full calibrations in the examples provided herein require at least 3 data points to perform a least squares fitting method for DC offset only (i.e. A>=3), and require at least 9 data points to perform a least squares fitting method for all three parameters (i.e. B>=9). A and B can be set as the minimum requirements or can be higher if desired. However, as will be shown, by requiring 4 values, the first, second and third values can be used to compute a DC offset for the first, second and third axes and the fourth value can be used to determine the radius of the sphere.

In the present example, once the number of readings in the list 74 is greater than or equal to 4, but not yet greater than or equal to 9, the fast calibration is initiated at 66*a*. The fast calibration may be repeated in order to more quickly increase the number of readings in the list 74 in order to initiate the full calibration at 66*b*. Once the fast calibration is successful, the foreground calibration 70 enters the UNCALIBRATED_DCO state. If the foreground calibration 70 is in the UNCALIBRATED or UNCALIBRATED_DCO states, once 9 or more readings are in the list 74, the full calibration is initiated at 66*b* in order to correct all three calibration parameters. Once the full calibration succeeds, the foreground calibration 70 enters the CALIBRATED state and the calibration ends at 88.

It may be noted that in this example, if the foreground calibration 70 is in the UNCALIBRATED_DCO or CALIBRATED states, the calibration corrections may be applied to the raw input sensor data in order to obtain the calibrated output data. With the foreground calibration 70 complete, it can be appreciated that an ongoing calibration can take over, e.g. to perform background calibrations when appropriate.

It can also be appreciated that separating the foreground calibration 70 into two stages, one comprising a fast calibration and the other comprising a full calibration, several desirable advantages are realized. The fast calibration initially provides coarse heading information with very little device movement required. As the user continues to move the mobile device 10, the fast calibration is able continually refine the calibration. Once the user has moved the mobile device 10 through more movements, a full and more accurate calibration is performed to compensate for all three parameters. In other words, as the user begins moving the mobile device 10, the magnetometer calibration module 26 can quickly begin calibrating the magnetometer sensor 22, even if the user has not yet progressed through a significant portion of the path.

As discussed above, the foreground calibration 70 may utilize a fast calibration to estimate and remove DC offset/bias from a set of readings, in this example of a three-axis magnetometer 20. Removing such an offset is considered important as the DC offset can be a significant contributor to the overall magnetometer inaccuracy.

Figure 21:
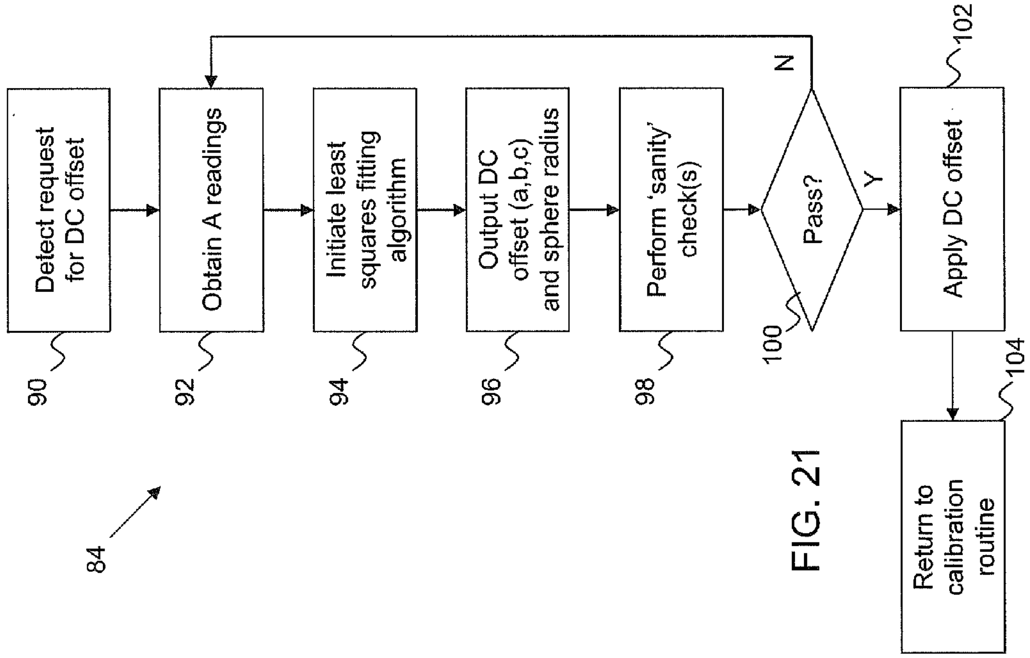
FIG. 21 is a flow chart comprising an example set of computer executable operations for performing a fast magnetometer calibration.

The fast calibration is initiated when 3 or more sufficiently different or unique readings have been obtained. FIG. 21 illustrates an example set of computer executable instructions for performing the fast calibration. At 90, the magnetometer calibration module 26 detects a request for a DC offset (i.e. the "fast" calibration). The A readings (e.g. 3 or more—in this example 4 to determine radius of sphere) are obtained at 92, and a least squares fitting algorithm is initiated at 94. The least squares fitting algorithm is used to find the best fit of the raw data to the model being used. It has been found that a suitable model assumes that the magnetic field is spherical with radius R and center at (t, u, v), namely: $(X-t)^2+(Y-u)^2+(Z-v)^2=R^2$. The output of the least squares fitting algorithm is then obtained at 96 and includes the values (t, u, v), and the radius R. The outputs may then be "sanity" checked at 98 to discard obviously erroneous results. For example, the minimum and maximum total magnetic strength over the entire earth are known and thus results that have an R value outside of this range can be deleted. Also, based on, for example, the mobile device's ADC (analog-to-digital conversion) range, upper and lower bounds of possible ranges of DC offsets can be performed to also eliminate likely erroneous results. Once a DC offset is found to pass the sanity checks at 100, the DC offset can be applied at 102 to correct the raw sensor readings, by subtracting the estimated DC offset for each axis. The magnetometer calibration module 26 may then return to the calibration routine which requested the fast calibration at 104 (i.e. the foreground calibration 84).

The full calibration is used to estimate and remove the effects of not only DC offset/bias, but also gain and inter-axis misalignment errors from a set of readings of a three-axis magnetometer 24. Removing such effects is important in order to maximize the overall accuracy of the magnetometer sensor 22 and the applications 28, 30 utilizing same.

Figure 22:
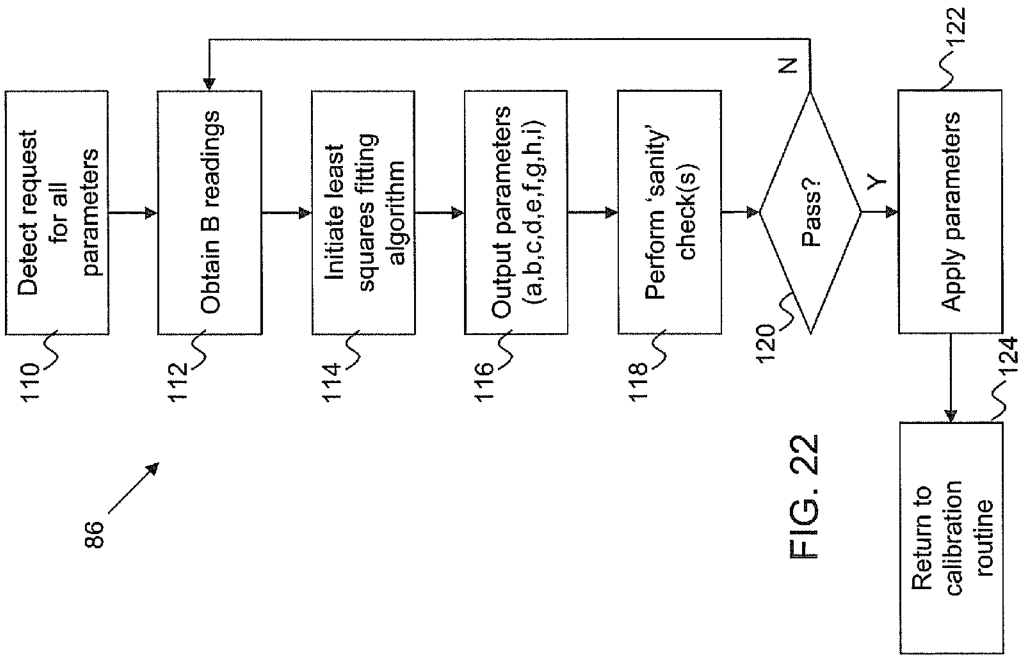
FIG. 22 is a flow chart comprising an example set of computer executable instructions for performing a full magnetometer calibration.

In this example embodiment, the full calibration is initiated when 9 or more sufficiently different or unique readings have been obtained. FIG. 22 illustrates an example set of computer executable instructions for performing the full calibration. At 110, the magnetometer calibration module 26 detects a request for all three parameters to be corrected (i.e. the "full" calibration). The B readings (e.g. 9 or more) are obtained at 112, and a least squares fitting algorithm is initiated at 114. The least squares fitting algorithm is used to find the best fit of the raw data to the model being used. It has been found that a suitable model assumes that the magnetic field has a center at (a, b, c) namely: $aX^2+bY^2+cZ^2+dXY+eXZ+fYZ+gX+hY+iZ=1$. The output of the least squares fitting algorithm is then obtained at 346 and includes the values (a, b, c, d, e, f, g, h, i), which are converted into gains, offsets and angles through a transformation as will be explained in greater detail below. The outputs may then be "sanity" checked at 118 to discard obviously erroneous results. For example, the quadratic equation above can represent many geometric shapes such as hyperboloids, cones, etc. However, it is understood from the physics of the magnetometer 20 that the correct solution to the model should be an ellipsoid. Thus, any non-ellipsoid solutions can be discarded. Additionally, other sanity checks such as knowledge of the minimum and maximum possible DC offsets, allowable range of gains, etc. can be used to discard other erroneous values. Once a DC offset is found to pass the sanity checks at 120, the DC offset can be applied at 122 to correct the raw sensor readings, by applying the calibration parameters to the incoming raw sensor samples in order to compensate for the biases, gains, and misalignment errors. The magnetometer calibration module 26 may then return to the calibration routine which requested the fast calibration at 124.

Figure 23:
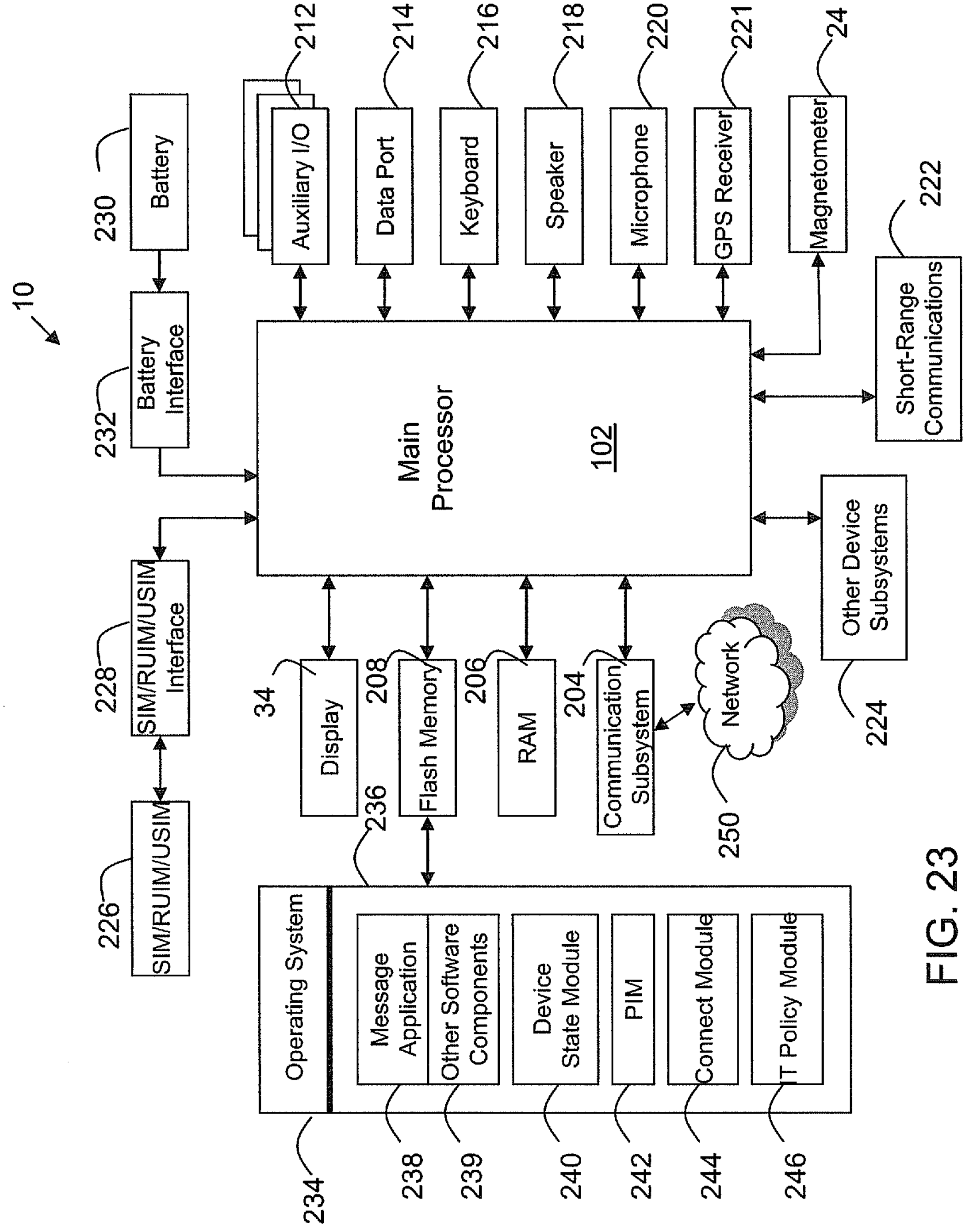
FIG. 23 is a block diagram of an example configuration for a mobile device.

Referring now to FIG. 23, shown therein is a block diagram of an example embodiment of a mobile device 10, which provides further detail thereof. The mobile device 10 comprises a number of components such as a main processor 202 that controls the overall operation of the mobile device 10. Communication functions, including data and voice communications, are performed through a communication subsystem 204. The communication subsystem 204 receives messages from and sends messages to a wireless network 250. In this example embodiment of the mobile device 10, the communication subsystem 204 is configured in accordance with the Global System for Mobile Communication (GSM) and General Packet Radio Services (GPRS) standards. The GSM/GPRS wireless network is used worldwide and it is expected that these standards will be superseded eventually by 3G and 4G networks such as EDGE, UMTS and HSDPA, LTE, Wi-Max etc. New standards are still being defined, but it is believed that they will have similarities to the network behaviour described herein, and it will also be understood by persons skilled in the art that the embodiments described herein are intended to use any other suitable standards that are developed in the future. The wireless link connecting the communication subsystem 204 with the wireless network 250 represents one or more different Radio Frequency (RF) channels, operating according to defined protocols specified for GSM/GPRS communications. With newer network protocols, these channels are capable of supporting both circuit switched voice communications and packet switched data communications.

The main processor 202 also interacts with additional subsystems such as a Random Access Memory (RAM) 206, a flash memory 208, a display 32, an auxiliary input/output (I/O) subsystem 212, a data port 214, a keyboard 216, a speaker 218, a microphone 220, GPS receiver 221, magnetometer 20, short-range communications 222, and other device subsystems 224.

Some of the subsystems of the mobile device 10 perform communication-related functions, whereas other subsystems may provide "resident" or on-device functions. By way of example, the display 32 and the keyboard 216 may be used for both communication-related functions, such as entering a text message for transmission over the network 250, and device-resident functions such as a calculator or task list.

The mobile device 10 can send and receive communication signals over the wireless network 250 after required network registration or activation procedures have been completed. Network access is associated with a subscriber or user of the mobile device 10. To identify a subscriber, the mobile device 10 may use a subscriber module. Examples of such subscriber modules include a Subscriber Identity Module (SIM) developed for GSM networks, a Removable User Identity Module (RUIM) developed for CDMA networks and a Universal Subscriber Identity Module (USIM) developed for 3G networks such as UMTS. In the example shown, a SIM/RUIM/USIM 226 is to be inserted into a SIM/RUIM/USIM interface 228 in order to communicate with a network. The SIM/RUIM/USIM component 226 is one type of a conventional "smart card" that can be used to identify a subscriber of the mobile device 10 and to personalize the mobile device 10, among other things. Without the component 226, the mobile device 10 may not be fully operational for communication with the wireless network 250. By inserting the SIM/RUIM/USIM 226 into the SIM/RUIM/USIM interface 228, a subscriber can access all subscribed services. Services may include: web browsing and messaging such as e-mail, voice mail, SMS, and MMS. More advanced services may include: point of sale, field service and sales force automation. The SIM/RUIM/USIM 226 includes a processor and memory for storing information. Once the SIM/RUIM/USIM 226 is inserted into the SIM/RUIM/USIM interface 228, it is coupled to the main processor 202. In order to identify the subscriber, the SIM/RUIM/USIM 226 can include some user parameters such as an International Mobile Subscriber Identity (IMSI). An advantage of using the SIM/RUIM/USIM 226 is that a subscriber is not necessarily bound by any single physical mobile device. The SIM/RUIM/USIM 226 may store additional subscriber information for a mobile device as well, including datebook (or calendar) information and recent call information. Alternatively, user identification information can also be programmed into the flash memory 208.

The mobile device 10 is typically a battery-powered device and may include a battery interface 232 for receiving one or more batteries 230 (typically rechargeable). In at least some embodiments, the battery 230 can be a smart battery with an embedded microprocessor. The battery interface 232 is coupled to a regulator (not shown), which assists the battery 230 in providing power V+ to the mobile device 10. Although current technology makes use of a battery, future technologies such as micro fuel cells may provide the power to the mobile device 10.

The mobile device 10 also includes an operating system (OS) 234 and software components 236 to 246. The operating system 234 and the software components 236 to 246 that are executed by the main processor 202 are typically stored in a persistent store such as the flash memory 208, which may alternatively be a read-only memory (ROM) or similar storage element (not shown). Those skilled in the art will appreciate that portions of the operating system 234 and the software components 236 to 246, such as specific device applications, or parts thereof, may be temporarily loaded into a volatile store such as the RAM 206. Other software components can also be included, as is well known to those skilled in the art.

The subset of software applications 236 that control basic device operations, including data and voice communication applications, may be installed on the mobile device 10 during its manufacture. Other software applications include a message application 238 that can be any suitable software program that allows a user of the mobile device 10 to send and receive electronic messages. Various alternatives exist for the message application 238 as is well known to those skilled in the art. Messages that have been sent or received by the user are typically stored in the flash memory 208 of the mobile device 10 or some other suitable storage element in the mobile device 10. In at least some embodiments, some of the sent and received messages may be stored remotely from the mobile device 10 such as in a data store of an associated host system that the mobile device 10 communicates with.

The software applications can further comprise a device state module 240, a Personal Information Manager (PIM) 242, and other suitable modules (not shown). The device state module 240 provides persistence, i.e. the device state module 240 ensures that important device data is stored in persistent memory, such as the flash memory 208, so that the data is not lost when the mobile device 10 is turned off or loses power.

The PIM 242 includes functionality for organizing and managing data items of interest to the user, such as, but not limited to, e-mail, contacts, calendar events, voice mails, appointments, and task items. A PIM application has the ability to send and receive data items via the wireless network 250. PIM data items may be seamlessly integrated, synchronized, and updated via the wireless network 250 with the mobile device subscriber's corresponding data items stored and/or associated with a host computer system. This functionality creates a mirrored host computer on the mobile device 10 with respect to such items. This can be particularly advantageous when the host computer system is the mobile device subscriber's office computer system.

The mobile device 10 may also comprise a connect module 244, and an IT policy module 246. The connect module 244 implements the communication protocols that are required for the mobile device 10 to communicate with the wireless infrastructure and any host system, such as an enterprise system, that the mobile device 10 is authorized to interface with.

The connect module 244 includes a set of APIs that can be integrated with the mobile device 10 to allow the mobile device 10 to use any number of services associated with the enterprise system. The connect module 244 allows the mobile device 10 to establish an end-to-end secure, authenticated communication pipe with a host system (not shown). A subset of applications for which access is provided by the connect module 244 can be used to pass IT policy commands from the host system to the mobile device 10. This can be done in a wireless or wired manner. These instructions can then be passed to the IT policy module 246 to modify the configuration of the device 10. Alternatively, in some cases, the IT policy update can also be done over a wired connection.

The IT policy module 246 receives IT policy data that encodes the IT policy. The IT policy module 246 then ensures that the IT policy data is authenticated by the mobile device 10. The IT policy data can then be stored in the flash memory 206 in its native form. After the IT policy data is stored, a global notification can be sent by the IT policy module 246 to all of the applications residing on the mobile device 10. Applications for which the IT policy may be applicable then respond by reading the IT policy data to look for IT policy rules that are applicable.

Other types of software applications or components 239 can also be installed on the mobile device 10. These software applications 239 can be pre-installed applications (i.e. other than message application 238) or third party applications, which are added after the manufacture of the mobile device 10. Examples of third party applications include games, calculators, utilities, etc.

The additional applications 239 can be loaded onto the mobile device 10 through at least one of the wireless network 250, the auxiliary I/O subsystem 212, the data port 214, the short-range communications subsystem 222, or any other suitable device subsystem 224. This flexibility in application installation increases the functionality of the mobile device 10 and may provide enhanced on-device functions, communication-related functions, or both. For example, secure communication applications may enable electronic commerce functions and other such financial transactions to be performed using the mobile device 10.

The data port 214 enables a subscriber to set preferences through an external device or software application and extends the capabilities of the mobile device 10 by providing for information or software downloads to the mobile device 10 other than through a wireless communication network. The alternate download path may, for example, be used to load an encryption key onto the mobile device 10 through a direct and thus reliable and trusted connection to provide secure device communication.

The data port 214 can be any suitable port that enables data communication between the mobile device 10 and another computing device. The data port 214 can be a serial or a parallel port. In some instances, the data port 214 can be a USB port that includes data lines for data transfer and a supply line that can provide a charging current to charge the battery 230 of the mobile device 10.

The short-range communications subsystem 222 provides for communication between the mobile device 10 and different systems or devices, without the use of the wireless network 250. For example, the subsystem 222 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download may be processed by the communication subsystem 204 and input to the main processor 202. The main processor 202 may then process the received signal for output to the display 32 or alternatively to the auxiliary I/O subsystem 212. A subscriber may also compose data items, such as e-mail messages, for example, using the keyboard 216 in conjunction with the display 32 and possibly the auxiliary I/O subsystem 212. The auxiliary subsystem 212 may comprise devices such as: a touch screen, mouse, track ball, infrared fingerprint detector, or a roller wheel with dynamic button pressing capability. The keyboard 216 is an alphanumeric keyboard and/or telephone-type keypad. However, other types of keyboards may also be used. A composed item may be transmitted over the wireless network 250 through the communication subsystem 204.

For voice communications, the overall operation of the mobile device 10 in this example is substantially similar, except that the received signals are output to the speaker 218, and signals for transmission are generated by the microphone 220. Alternative voice or audio I/O subsystems, such as a voice message recording subsystem, can also be implemented on the mobile device 10. Although voice or audio signal output is accomplished primarily through the speaker 218, the display 32 can also be used to provide additional information such as the identity of a calling party, duration of a voice call, or other voice call related information.

It will be appreciated that any module or component exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the mobile device 10 (or other computing or communication device that utilizes similar principles) or accessible or connectable thereto. Any application or module herein described may be implemented using computer readable/executable instructions that may be stored or otherwise held by such computer readable media.

It will be appreciated that the example embodiments and corresponding diagrams used herein are for illustrative purposes only. Different configurations and terminology can be used without departing from the principles expressed herein. For instance, components and modules can be added, deleted, modified, or arranged with differing connections without departing from these principles.

The steps or operations in the flow charts and diagrams described herein are just for example. There may be many variations to these steps or operations without departing from the spirit of the invention or inventions. For instance, the steps may be performed in a differing order, or steps may be added, deleted, or modified.

Although the above principles have been described with reference to certain specific example embodiments, various modifications thereof will be apparent to those skilled in the art as outlined in the appended claims.

The invention claimed is:

1. A method of operating a mobile communication device having a magnetometer, the method for obtaining magnetometer readings when performing a magnetometer calibration, the method comprising;

displaying a plurality of visual elements representing a path comprising at least a pair of movements, one of the movements including rotating the mobile communication device about a first axis while facing a first direction, the other of the movements including rotating the mobile communication device about the first axis along the mobile communication device, each of the movements orienting the mobile communication device in substantially opposite positions with respect to the first axis; and obtaining magnetometer readings comprising a range of values for at least two axes during movement of the mobile communication device according to the path.

2. The method according to claim 1, wherein the one of the movements is represented by a first visual element illustrating the mobile communication device in an upright position and a second visual element illustrating the mobile communication device in an upside down position.

3. The method according to claim 2, wherein the one of the movements is further represented by a third visual element illustrating the mobile communication device in a sideways position, the third visual element being placed along a portion of the path between the first and second visual elements.

4. The method according to claim 2, wherein the other of the movements is represented by a third visual element illustrating the mobile communication device facing a second direction and a fourth visual element illustrating the device facing the first direction, wherein movement between the first and second directions orients the mobile communication device in the substantially opposite positions with respect to the first axis.

5. The method according to claim 4, wherein the other of the movements is further represented by a fifth visual element illustrating the mobile communication device facing a third direction, the fifth visual element placed along a portion of the path between the third and fourth visual elements.

6. The method according to claim 5, wherein the third visual element illustrates the mobile communication device facing downwardly, the fifth visual element illustrates the mobile communication device facing upwardly, and the first and fourth visual elements are the same.

7. The method according to claim 4, wherein the third visual element illustrates the mobile communication device facing downwardly and the first and fourth visual elements are the same.

8. The method according to claim 1, wherein the one of the movements is represented by a first visual element illustrating the mobile communication device facing the first direction and a second visual element illustrating the mobile communication device facing in a second direction, wherein movement between the first and second directions orients the mobile communication device in the substantially opposite positions with respect to the first axis.

9. The method according to claim 1, wherein the plurality of visual elements defines the path by using one or more arrows between the plurality of visual elements of the mobile communication device.

10. The method according to claim 9, wherein the path comprises a cycle, wherein a last of the plurality of visual elements follows the path towards a first of the plurality of visual elements.

11. The method according to claim 1, wherein the plurality of visual elements are displayed in a single screen, or the plurality of visual elements are displayed in a plurality of screens.

12. The method according to claim 1, further comprising providing a notification upon determining that a predetermined number of magnetometer readings have been obtained.

13. The method according to claim 12, wherein the notification comprises haptic feedback.

14. The method according to claim 1, wherein the visual elements comprise text.

15. The method according to claim 1, further comprising displaying one or more instructions with the plurality of visual elements using text.

16. An electronic device for obtaining magnetometer readings when performing a magnetometer calibration, the electronic device comprising a processor, memory, a display, and a magnetometer, the memory storing computer executable instructions for:

displaying a plurality of visual elements representing a path comprising at least a pair of movements, one of the movements including rotating the electronic device about a first axis while facing a first direction, the other of the movements including rotating the electronic device about the first axis along the electronic device, each of the movements orienting the electronic device in substantially opposite positions with respect to the first axis; and obtaining magnetometer readings comprising a range of values for at least two axes during movement of the electronic device according to the path.

17. The electronic device according to claim 16, wherein the one of the movements is represented by a first visual element illustrating the electronic device in an upright position and a second visual element illustrating the electronic device in an upside down position.

18. The electronic device according to claim 17, wherein the one of the movements is further represented by a third visual element illustrating the electronic device in a sideways position, the third visual element being placed along a portion of the path between the first and second visual elements.

19. The electronic device according to claim 17, wherein the other of the movements is represented by a third visual element illustrating the electronic device facing a second direction and a fourth visual element illustrating the device facing the first direction, wherein movement between the first and second directions orients the electronic device in the substantially opposite positions with respect to the first axis.

20. The electronic device according to claim 19, wherein the other of the movements is further represented by a fifth visual element illustrating the mobile communication device facing a third direction, the fifth visual element placed along a portion of the path between the third and fourth visual elements.

21. The electronic device according to claim 20, wherein the third visual element illustrates the mobile communication device facing downwardly, the fifth visual element illustrates the mobile communication device facing upwardly, and the first and fourth visual elements are the same.

22. The electronic device according to claim 19, wherein the third visual element illustrates the electronic device facing downwardly and the first and fourth visual elements are the same.

23. The electronic device according to claim 16, wherein the one of the movements is represented by a first visual element illustrating the electronic device facing the first direction and a second visual element illustrating the electronic device facing in a second direction, wherein movement between the first and second directions orients the electronic device in the substantially opposite positions with respect to the first axis.

24. The electronic device according to claim 16, wherein the plurality of visual elements defines the path by using one or more arrows between the plurality of visual elements of the electronic device.

25. The electronic device according to claim 24, wherein the path comprises a cycle, wherein a last of the plurality of visual elements follows the path towards a first of the plurality of visual elements.

26. The electronic device according to claim 16, wherein the plurality of visual elements are displayed in a single screen, or the plurality of visual elements are displayed in a plurality of screens.

27. The electronic device according to claim 16, wherein the memory further stores computer executable instructions for providing a notification upon determining that a predetermined number of magnetometer readings have been obtained.

28. The electronic device according to claim 27, wherein the notification comprises haptic feedback.

29. The electronic device according to claim 16, wherein the visual elements comprise text.

30. The electronic device according to claim 16, wherein the memory further stores computer executable instructions for displaying one or more instructions with the plurality of visual elements using text.

31. A computer readable storage medium for operating a mobile communication device having a magnetometer to obtain magnetometer readings when performing a magnetometer calibration, the computer readable storage medium storing computer executable instructions for:

displaying a plurality of visual elements representing a path comprising at least a pair of movements, one of the movements including rotating the mobile communication device about a first axis while facing a first direction, the other of the movements including rotating the mobile communication device about the first axis along the mobile communication device, each of the movements orienting the mobile communication device in substantially opposite positions with respect to the first axis, and obtaining magnetometer readings comprising a range of values for at least two axes during movement of the mobile communication device according to the path.

* * * * *

UNITED STATES PATENT AND TRADEMARK OFFICE

CERTIFICATE OF CORRECTION

PATENT NO. : 8,432,156 B2
APPLICATION NO. : 13/104420
DATED : April 30, 2013
INVENTOR(S) : Nazih Almalki, Laura Mahan and Jeffrey Alton Hugh Dods It is certified that error appears in the above-identified patent and that said Letters Patent is hereby corrected as shown below:

In the Claims:

In Column 18, lines 10, 15, and 17, "mobile communication device" is replaced with "electronic device".

Signed and Sealed this
Thirteenth Day of August, 2013

Teresa Stanek Rea
*Acting Director of the United States Patent and Trademark Office*